(12) United States Patent
Wolk et al.

(10) Patent No.: US 11,273,630 B2
(45) Date of Patent: *Mar. 15, 2022

(54) ELECTRICAL MULTILAYER LAMINATION TRANSFER FILMS

(71) Applicant: 3M INNOVATIVE PROPERTIES COMPANY, St. Paul, MN (US)

(72) Inventors: Martin B. Wolk, Woodbury, MN (US); Michael Benton Free, Baytown, MN (US); Daniel J. Schmidt, Woodbury, MN (US); Justin P. Meyer, Oakdale, MN (US); Mark J. Pellerite, Woodbury, MN (US); Stephen A. Johnson, Woodbury, MN (US); Terry O. Collier, Woodbury, MN (US); Xiaohua Ma, Woodbury, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 124 days.

This patent is subject to a terminal disclaimer.

(21) Appl. No.: 16/532,618

(22) Filed: Aug. 6, 2019

(65) Prior Publication Data

US 2019/0358947 A1 Nov. 28, 2019

Related U.S. Application Data

(62) Division of application No. 15/505,984, filed as application No. PCT/US2015/046990 on Aug. 26, 2015, now Pat. No. 10,414,145.

(Continued)

(51) Int. Cl.
*B32B 27/18* (2006.01)
*B32B 38/00* (2006.01)
(Continued)

(52) U.S. Cl.
CPC ............ *B32B 38/0036* (2013.01); *B32B 3/26* (2013.01); *B32B 7/025* (2019.01); *B32B 7/06* (2013.01);
(Continued)

(58) Field of Classification Search
CPC ............ B32B 2457/00; B32B 2457/10; B32B 37/025; B32B 38/0036; B32B 38/10;
(Continued)

(56) References Cited

U.S. PATENT DOCUMENTS

RE24,906 E   12/1960  Ulrich
4,737,577 A   4/1988  Brown
(Continued)

FOREIGN PATENT DOCUMENTS

CN   101515651   8/2009
EP   1690677   8/2006
(Continued)

OTHER PUBLICATIONS

Dinachali, "A Universal Scheme for Patterning of Oxides via Thermal Nanoimprint Lithography", Adv. Funct. Mater., 2013, vol. 23, No. 7, pp. 2201-2211.
(Continued)

*Primary Examiner* — Lawrence D Ferguson
(74) *Attorney, Agent, or Firm* — Jonathan L. Tolstedt (57) ABSTRACT

Transfer films, articles made therewith, and methods of making and using transfer films to form an electrical stack are disclosed. The transfer films may include a plurality of co-extensive electrical protolayers forming an electrical protolayer stack, at least selected or each electrical protolayer independently comprising at least 25 wt % sacrificial material and a thermally stable material and having a uniform thickness of less than 25 micrometers. The transfer films may include a plurality of co-extensive electrical (Continued)

protolayers forming an electrical protolayer stack, at least selected or each protolayer independently exhibiting a complex viscosity of between $10^3$ and $10^4$ Poise at a shear rate of 100/s when heated to a temperature between its $T_g$ and $T_{dec}$.

11 Claims, 3 Drawing Sheets

Related U.S. Application Data (60) Provisional application No. 62/042,481, filed on Aug. 27, 2014.

(51) Int. Cl.

| | | |
|---|---|---|
| *H01G 4/30* | (2006.01) | |
| *B32B 37/00* | (2006.01) | |
| *B32B 38/10* | (2006.01) | |
| *H01L 51/00* | (2006.01) | |
| *B32B 7/025* | (2019.01) | |
| *B32B 7/06* | (2019.01) | |
| *B32B 17/06* | (2006.01) | |
| *B32B 3/26* | (2006.01) | |
| *H01M 4/04* | (2006.01) | |
| *H01M 6/40* | (2006.01) | |
| *B32B 27/08* | (2006.01) | |
| *H01M 6/00* | (2006.01) | |
| *H01M 10/02* | (2006.01) | |

(52) U.S. Cl.
CPC .............. *B32B 17/06* (2013.01); *B32B 27/18* (2013.01); *B32B 37/025* (2013.01); *B32B 38/10* (2013.01); *H01G 4/308* (2013.01); *H01L 51/003* (2013.01); *B32B 27/08* (2013.01); *B32B 2307/302* (2013.01); *B32B 2307/50* (2013.01); *B32B 2457/00* (2013.01); *B32B 2457/10* (2013.01); *H01M 4/0471* (2013.01); *H01M 6/005* (2013.01); *H01M 6/40* (2013.01); *H01M 10/02* (2013.01)

(58) Field of Classification Search
CPC ..... H01G 4/308; H01L 51/003; H01M 10/02; H01M 4/0471; H01M 6/005; H01M 6/40; Y02E 60/10
See application file for complete search history.

(56) References Cited

U.S. PATENT DOCUMENTS

| | | |
|---|---|---|
| 4,949,005 A | 8/1990 | Parham et al. |
| 5,208,121 A | 5/1993 | Yahnke et al. |
| 5,849,162 A | 12/1998 | Bartolomei et al. |
| 5,976,424 A | 11/1999 | Weber et al. |
| 6,376,590 B2 | 4/2002 | Kolb et al. |
| 6,396,079 B1 | 5/2002 | Hayashi et al. |
| 6,399,672 B1 | 6/2002 | Ceska et al. |
| 6,582,807 B2 | 6/2003 | Baer et al. |
| 6,827,886 B2 | 12/2004 | Neavin et al. |
| 6,849,558 B2 | 2/2005 | Schaper |
| 6,855,178 B2 | 2/2005 | Uchida et al. |
| 7,203,055 B2 | 4/2007 | Shin et al. |
| 7,241,437 B2 | 7/2007 | Davidson et al. |
| 7,256,936 B2 | 8/2007 | Hebrink et al. |
| 7,294,298 B2 | 11/2007 | Iijima |
| 7,508,130 B2 | 3/2009 | Cok |
| 7,744,987 B2 | 6/2010 | Hebrink et al. |
| 7,834,545 B2 | 11/2010 | Zhang et al. |
| 8,234,998 B2 | 8/2012 | Krogman et al. |
| 8,282,863 B2 | 10/2012 | Jones et al. |
| 8,313,798 B2 | 11/2012 | Nogueira et al. |
| 8,792,165 B2 | 7/2014 | Merrill et al. |
| 9,102,131 B2 | 8/2015 | Derks et al. |
| 9,119,289 B2 | 8/2015 | Kelley et al. |
| 9,586,385 B2 | 3/2017 | Wolk et al. |
| 2003/0214695 A1 | 11/2003 | Abramson |
| 2005/0141093 A1 | 6/2005 | Weber |
| 2006/0068128 A1 | 3/2006 | Greener et al. |
| 2006/0269762 A1 | 11/2006 | Pulugurtha et al. |
| 2007/0047080 A1 | 3/2007 | Stover |
| 2007/0259474 A1 | 11/2007 | Shin |
| 2010/0014366 A1 | 1/2010 | Nam et al. |
| 2010/0075136 A1 | 3/2010 | Song |
| 2010/0178480 A1 | 7/2010 | Colodrero Perez et al. |
| 2010/0272990 A1 | 10/2010 | Bondesan et al. |
| 2010/0290109 A1 | 11/2010 | Kurt et al. |
| 2010/0308277 A1 | 12/2010 | Grupp |
| 2011/0149400 A1 | 6/2011 | Miguez Garcia et al. |
| 2012/0025182 A1 | 2/2012 | Umeda et al. |
| 2012/0200908 A1 | 8/2012 | Bergh et al. |
| 2013/0011608 A1 | 1/2013 | Wolk |
| 2013/0101816 A1 | 8/2013 | Liu et al. |
| 2014/0021492 A1 | 1/2014 | Wolk et al. |
| 2014/0238731 A1 | 8/2014 | Kelley et al. |
| 2014/0242343 A1 | 8/2014 | Free et al. |

FOREIGN PATENT DOCUMENTS

| | | |
|---|---|---|
| EP | 1780007 | 5/2007 |
| EP | 2244033 | 10/2010 |
| EP | 2905132 | 8/2015 |
| JP | 4821136 | 11/2011 |
| JP | 2013062242 | 4/2013 |
| KR | 20080056967 | 6/2008 |
| WO | WO 2008-033889 | 3/2008 |
| WO | WO 2010/074862 | 7/2010 |
| WO | WO 2011-088161 | 7/2011 |
| WO | WO 2013/052927 | 4/2013 |
| WO | WO 2013/165726 | 11/2013 |
| WO | WO 2014/099367 | 6/2014 |
| WO | WO 2014-133799 | 9/2014 |
| WO | WO 2015/088932 | 6/2015 |

OTHER PUBLICATIONS

Götschel, "Processing of preceramic paper and ceramic green tape derived multilayer structures", Advances in Applied Ceramics, 2013, vol. 112, No. 6, pp. 358-365.

Granqvist, "Electrochromics for smart windows: Oxide-based thin films and devices", Thin Solid Films, 2014, vol. 564, pp. 1-38.

Granqvist, "Oxide electrochromics: An introduction to devices and materials", Solar Energy Materials & Solar Cells, 2012, vol. 99, pp. 1-13.

Huang, "Structure and Performance of Dielectric Films Based On Self-Assembled Nanocrystals with a High Dielectric Constant", Nanotechnology, 2013, vol. 24, No. 415602, pp. 1-16.

Kim, "Effects of the Substrate Pretreatments on the Leakage Current In the Low-Temperature Pol-Si TFTs", Mat. Res. Soc. Symp. Proc., 1997, vol. 448, pp. 419-423.

Kim, "Fabrication of Temperature-Stable Multilayer Ceramic Capacitor in the (1-x-y)PMN-xPT-yPNW Ternary System", J. Ceramic Soc. Jap., 2003, vol. 111, No. 1291, pp. 0212-0216.

Kondoh, "Surface treatment of sheet glass. Present status and future prospects Journal of Non-Crystalline Solids", J. of Non-Crystall ine Solids, 1994, vol. 178, pp. 189-198.

Krogman, "Industrial-scale spray layer-by-layer assembly for production of biomimetic photonic systems", Bioinspir. Biomim, Dec. 2013, vol. 8, No. 4, 11 pages.

Krogman, "Automated Process for Improved Uniformity and Versatility of Layer-by-Layer Deposition", Langmuir, 2007, vol. 23, No. 6, pp. 3137-3141.

Kurt, "Structural color via layer-by-layer deposition: layered nanoparticle arrays with near-UV and visible reflectivity bands", Journal of Materials Chemistry, 2009, vol. 19, pp. 8920-8927.

Lim, "NIP26: 26th International Conference on Digital Printing Technologies and Digital Fabrication", Technical Programs and Proceedings (2010), pp. 723-725.

(56) References Cited

OTHER PUBLICATIONS

McCleskey, "Nucleation and growth of epitaxial metal-oxide films based on polymer-assisted deposition", Chem. Soc. Rev., 2014, vol. 43, No. 1, pp. 2141-2146.

Mistler, Tape Casting: Theory and Practice, Section 2.4 "Binders" 37-45 (2000).

Nicolaidis, "Forming of Ceramic Laminates Comprising Thin Layers of a Few Particles", J. Am. Ceram. Soc., Jul. 2008, vol. 91, No. 7, pp. 2124-2129.

Nogueira, "Spray-Layer-by-Layer Assembly Can More Rapidly Produce Optical-Quality Multistack Heterostructures", Langmuir, 2011, vol. 27, No. 12, pp. 7860-7867.

Park, "Multicomponent Patterning of Layer-by-Layer Assembled polyyelectrolyte/Nanoparticle Composite Thin Films with Controlled Alignment", Adv. Mater. 2005, vol. 17, pp. 2575-2579.

Sharmin, "Optimization Of Binder Removal For Ceramic Microfabrication Via Polymer Co-Extrusion", Ceramics International, 2014, vol. 40, pp. 3939-3946.

Shaw, "Negative photoresists for optical lithography", IBM J. Res. Develop., Jan./Mar. 1997, vol. 41, No. 1/2, pp. 81-94.

Shimomura, "Layer-by-Layer-Assembled High-Performance Broadband Antireflection Coatings", ACS Applied Materials & Interfaces, 2010, vol. 2, No. 3, pp. 813-820.

Thomas, "Single-layer $TiO_2$ and multilayer $TiO_2$-$SiO_2$ optical coatings prepared from colloidal suspensions", Applied Optics, Nov. 1, 1987, vol. 26, No. 21, pp. 4688-4691.

Wang, "Patterning of Polymeric/Inorganic Nanocomposite and Nanoparticle Layers", Chem. Mater., 2002, vol. 14, No. 11, pp. 4812-4818.

Wee, "Multilayered Poly(p-phenylenevinylene)/Reduced Graphene Oxide Film: An Efficient Organic Current Collector in an All-Plastic Supercapacitor", Langmuir, 2014, vol. 30, pp. 1-9.

Wu, "Structural Color in Porous, Superhydrophilic, and Self-Cleaning $SiO_2$/$TiO_2$ Bragg Stacks", Small, 2007, vol. 3, No. 8, pp. 1445-1451.

Yu, "Titania Opal and Inverse Opal Structures via Templating Polyelectrolyte Multilayer Coated Polystyrene Spheres", Current Nanoscience, 2010, vol. 6, No. 2, pp. 206-212.

Zou, "Polymer-assisted-deposition: a chemical solution route for a wide range of materials", Chem. Soc. Rev., 2013, vol. 42, pp. 439-449.

International search report for PCT International Application No. PCT/US2015/046990 dated Feb. 2, 2016, 7 pages.

Later publication of ISR dated Apr. 4, 2016.

ELECTRICAL MULTILAYER LAMINATION TRANSFER FILMS

BACKGROUND

Many common electrical devices can be fabricated in a continuous manner on a flexible substrate. Continuous film-based methods have been demonstrated for complete or partial fabrication of capacitors, resistors, thin film batteries, organic photovoltaics (OPVs), organic light emitting diodes (OLEDs), and other components. However, there are fewer continuous techniques available for producing fully integrated multilayer electrical films, especially those with a large number of layers and electrodes, for example over 100 layers. Also, many thin film electrical devices are produced through multiple vapor deposition and patterning steps. Accordingly, a need exists for complex electrical devices and methods to fabricate them.

SUMMARY

The present disclosure relates to multilayer lamination transfer films, methods of forming these lamination transfer films and methods of using these lamination transfer films. These lamination transfer films utilize electrical protolayers that can be electrically coupled after a high temperature step that removes sacrificial material and densifies thermally stable material.

In one aspect, a transfer film includes a plurality of co-extensive electrical protolayers forming an electrical protolayer stack. At least selected or each electrical protolayer independently comprises at least 25 wt % sacrificial material and a thermally stable material and a uniform thickness of less than 25 micrometers.

In another aspect, a transfer film includes a plurality of co-extensive electrical protolayers forming an electrical protolayer stack. At least selected or each protolayer independently exhibits a complex viscosity of between $10^3$ and $10^4$ Poise at a shear rate of 100/s when heated to a temperature between its $T_g$ and $T_{dec}$.

In another aspect, a transfer film includes a plurality of interdigitated electrical protolayers forming an electrical protolayer stack. At least selected or each electrical protolayer independently comprises at least 25 wt % sacrificial material and a thermally stable material and a uniform thickness of less than 25 micrometers.

In a further aspect, a transfer film includes a plurality of interdigitated electrical protolayers forming an electrical protolayer stack. At least selected or each protolayer independently exhibits a complex viscosity of between $10^3$ and $10^4$ Poise at a shear rate of 100/s when heated to a temperature between its $T_g$ and $T_{dec}$.

In another aspect, a method includes laminating a transfer film, described herein, to a receptor substrate and baking out sacrificial material to form an electrical stack.

In a further aspect, a method includes depositing a plurality of interdigitated electrical protolayers to form an electrical protolayer stack. Each protolayer independently has sacrificial material and a thermally stable material and a uniform thickness of less than 25 micrometers.

In still a further aspect, a method includes co-extruding a plurality of interdigitated electrical protolayers to form an electrical protolayer stack. Each protolayer independently includes a sacrificial material and a thermally stable material.

In still a further aspect, a method includes co-extruding a plurality of electrical protolayers to form an electrical protolayer stack. Each protolayer independently includes a sacrificial material and a thermally stable material.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

DETAILED DESCRIPTION

In the following detailed description, reference is made to the accompanying drawings that form a part hereof, and in which are shown by way of illustration several specific embodiments. It is to be understood that other embodiments are contemplated and may be made without departing from the scope or spirit of the present disclosure. The following detailed description, therefore, is not to be taken in a limiting sense.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise.

As used in this specification and the appended claims, the term "or" is generally employed in its sense including "and/or" unless the content clearly dictates otherwise.

As used herein, "have", "having", "include", "including", "comprise", "comprising" or the like are used in their open ended sense, and generally mean "including, but not limited to". It will be understood that "consisting essentially of", "consisting of", and the like are subsumed in "comprising," and the like.

In this disclosure:

"bake-out" refers to the process of substantially removing sacrificial material present in a layer by pyrolysis, combustion, sublimation, or vaporization;

"bake-out temperature" refers to the maximum temperature reached during the process of substantially removing sacrificial materials in a layer by pyrolysis, combustion, sublimation, or vaporization;

"combust" or "combustion" refers to a process of heating a layer that comprises organic materials in an oxidizing atmosphere so that organic materials undergo a chemical reaction with the oxidant;

"pyrolyze" or "pyrolysis" refers to a process of heating sacrificial materials in an inert atmosphere so that they decompose;

"electrical protolayer" refers to a layer in the transfer film that is a precursor layer to the electrical layer in the final baked out electrical stack where the electrical layer functions as a conductor, insulator, functional electrode, electrolyte, oxidant, or reductant;

"electrical stack" refers to two or more layers that in combination produce electrical effects. These effects could include phenomena occurring across the interfaces within the electrical stack such as ion conduction, electron conduction, charge separation, etc. The electrical stack can also exhibit composite performance including capacitance, energy storage, energy harvesting, etc. Other composite performance attributes may include electrochromism, spatial light modulation, and other electro-optic phenomena.

"thermally stable" refers to materials that remain substantially intact during the removal of sacrificial materials, or chemical precursors to materials that remain substantially intact during the removal of sacrificial materials.

"densify" or "densification" refers to the process by which the weight and/or volume fraction of the thermally stable material is increased during the bake-out process. For example, in a densified layer the local concentration (weight or volume %) of nanoparticles is increased relative to that in the protolayer. However, the average volume of the individual nanoparticles may not change as a result of the densification process.

The present disclosure relates to multilayer lamination transfer films, methods of forming these lamination transfer films, and methods of using these lamination transfer films. These multilayer lamination transfer films utilize electrical protolayers that can be electrically coupled after a high temperature step that removes sacrificial material and densifies thermally stable material. Potentially, the process can be used to produce large area, filmless, durable inorganic electrical devices such as electrochromic windows, photovoltaic devices, capacitors, supercapacitors, batteries, resistors, actuators, and energy harvesters, for example. Transfer films described herein include a plurality of co-extensive or interdigitated electrical protolayers forming an electrical protolayer stack. Each electrical protolayer independently includes a sacrificial material and a thermally stable material and may have a thickness of less than 25 micrometers. In many embodiments, at least selected or each electrical protolayer independently has at least 25 wt % sacrificial material and a thermally stable material and a uniform thickness of less than 25 micrometers. In many embodiments, at least selected or each protolayer independently exhibits a complex viscosity of between $10^3$ and $10^4$ Poise at a shear rate of 100/s when heated to a temperature between its $T_g$ and $T_{dec}$. These electrical transfer films can be laminated onto a thermally stable receptor substrate and baked out to form electrical stacks for use in devices such as, electrochromic windows, photovoltaic devices, capacitors, supercapacitors, batteries, actuators, and energy harvesters that are all based on multilayer constructions with discrete layers that function as conductors, insulators, functional electrodes, electrolytes, oxidants, or reductants. Thus the electrical protolayers are precursors to inorganic electrical layers that function as conductors, insulators, oxidants, reductants, electrolytes, etc. The electrical protolayers can be formulated, coated, layered in a stack, and baked in such a way that the thermally stable components of the electrical protolayers within the stack densify, stratify, and physically bind together during the bake step. The use of electrical protolayers allows for processing of inorganic materials at a low volume loading (e.g. sub-percolation concentrations for conductive materials), enabling techniques such as thermoplastic extrusion of multilayers. Any number of electrical protolayers can be utilized such as 3 or more, 5 or more, 10 or more, 25 or more, 50 or more, 100 or more, or 500 or more. While the present disclosure is not so limited, an appreciation of various aspects of the disclosure will be gained through the discussion provided below.

Figure 1:
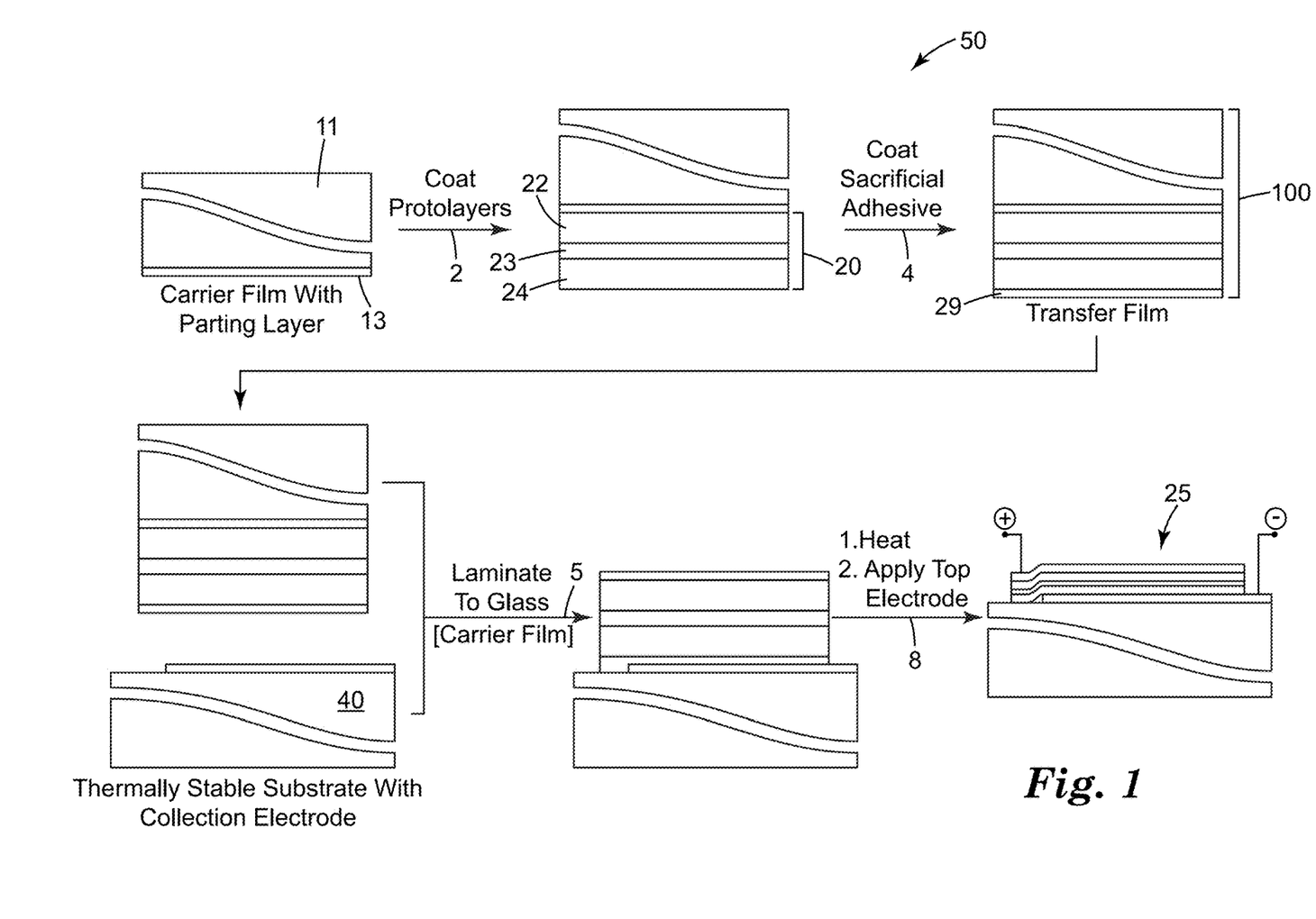
FIG. 1 is a schematic process flow diagram of an illustrative method of forming the transfer film and the electrical stack.

FIG. 1 is a schematic process flow diagram 50 of an illustrative method of forming the transfer film 100 and the electrical stack 25. In some embodiments, the functional electrical device is completed by addition of a top electrode in a subsequent processing step. Any of the conventional means of electrode application may be used, including, for example, vacuum deposition of conducting inorganic thin films, application of conductive inks, and application of conductive adhesives or tapes.

Figure 3:
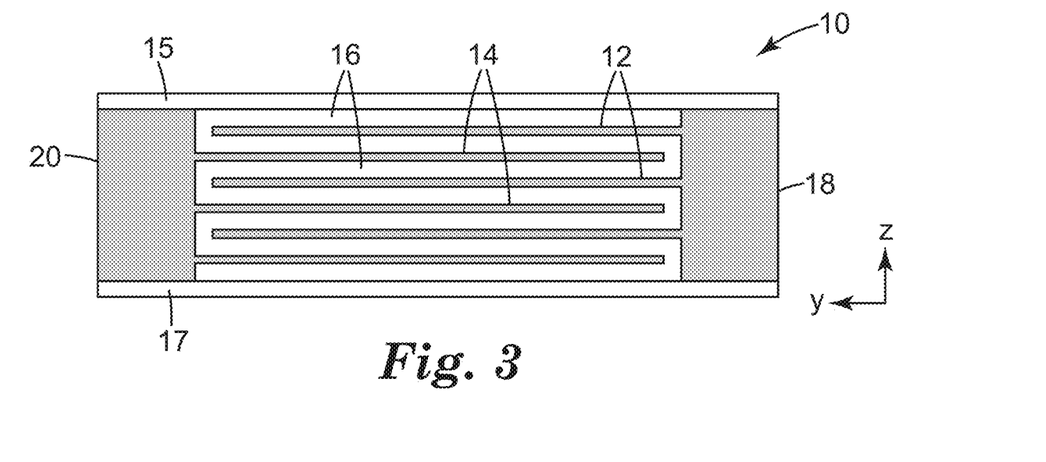
FIG. 3 is a cross-sectional schematic diagram of a multilayer interdigitated electrode film with buried electrodes and vertical bus bars.
Figure 4:
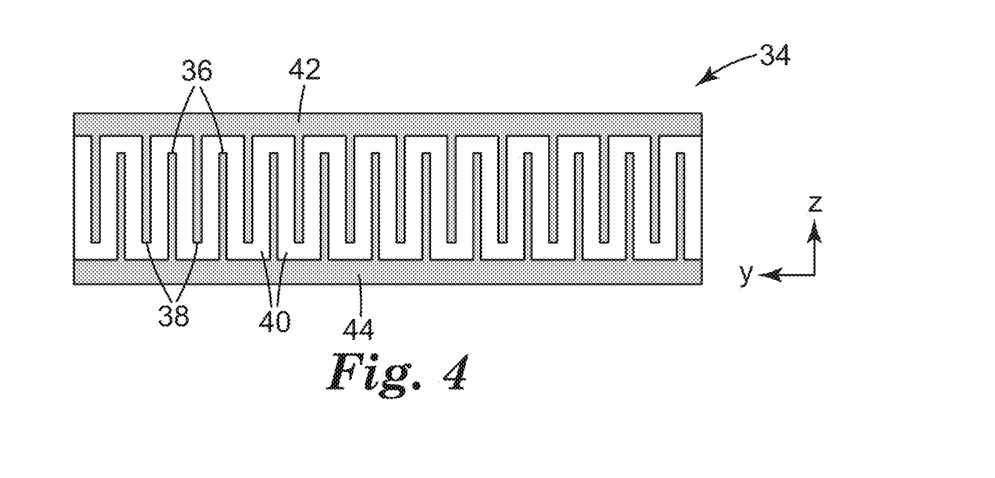
FIG. 4 is a cross-sectional schematic diagram of a multilane interdigitated electrode film with horizontal bus bars.

The transfer film 100 includes a plurality of substantially parallel layers (or electrical protolayers) 22, 23 and 24 forming a protolayer stack 20. These substantially parallel layers (or electrical protolayers) can be co-extensive as illustrated in FIG. 1 or interdigitated as illustrated in FIG. 3 and FIG. 4. The substantially parallel layers can include offset electrical protolayers in the electrical protolayer stack. Electrical protolayer stacks with offset electrical protolayers may have a small fraction of one or more of the electrical protolayers extending from the electrical protolayer stack to allow for electrical connection in the baked-out electrical stack. The fraction of the layer in the offset may be 25% of the layer width, or 10% of the layer width, or 5% of the layer width, or 1% of the layer width, While FIG. 1 and FIG. 2 illustrate three electrical protolayers 22, 23 and 24 forming a protolayer stack 20, it is understood that the protolayer stack 20 can include any useful number of electrical protolayers such as at least 3, at least 5, at least 10, at least 25, at least 50, at least 100, or at least 500 electrical protolayers.

Figure 2:
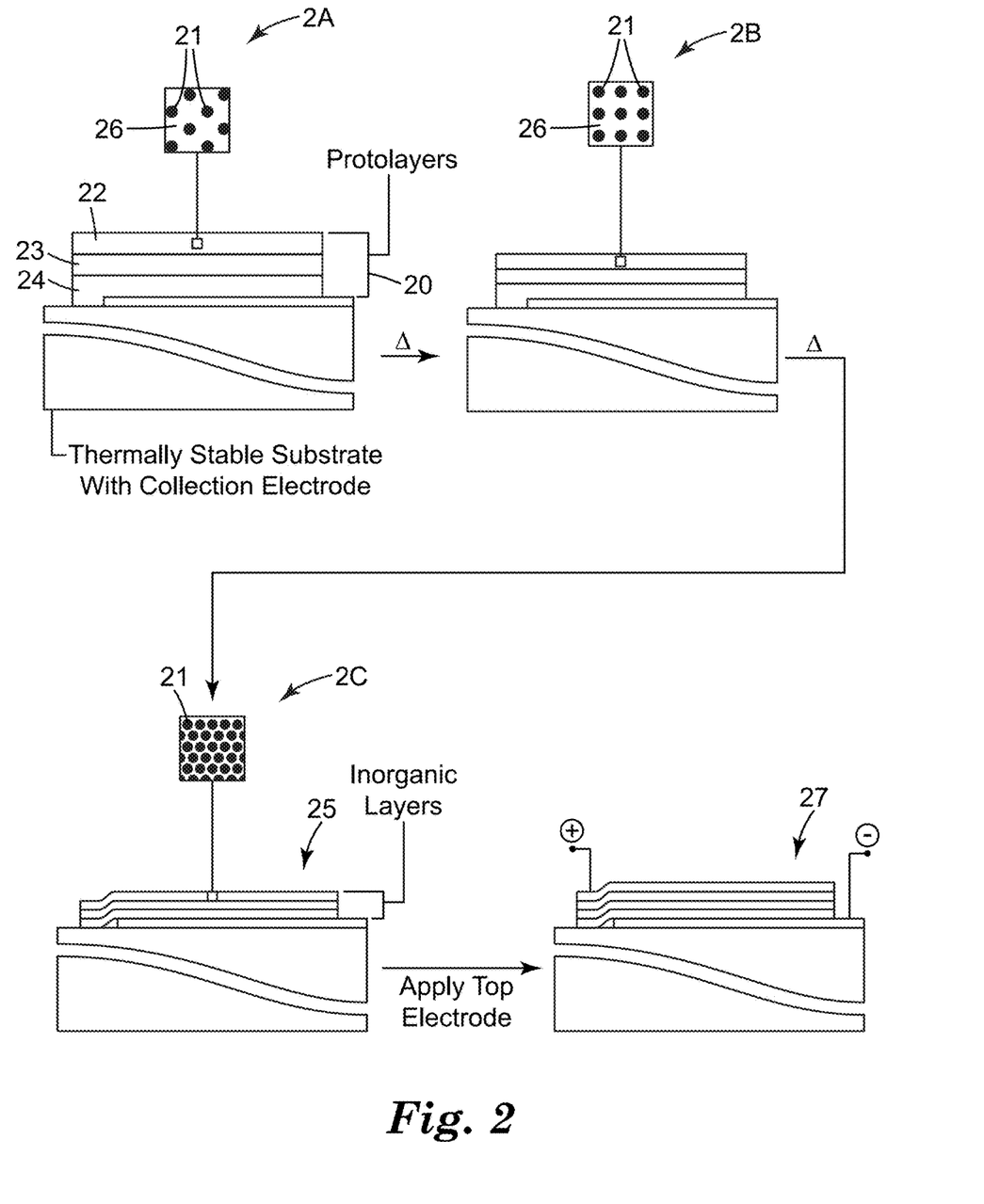
FIG. 2 is a schematic diagram of a three layer electrical stack with a negative and positive electrode formed by lamination transfer and baking out.

FIG. 2 is a schematic diagram of the electrical protolayer stack 20 densification during the bake-out step. Each layer 22, 23 and 24 independently includes a sacrificial material 26 and a thermally stable material 21 and is illustrated as generally uniform co-extensive but can be interdigitated as illustrated in FIG. 3 and FIG. 4.

In many embodiments the protolayers 22, 23, and 24 each have a uniform thickness of less than 30 micrometers or less than 25 micrometers or less than 20 micrometers or less than 15 micrometers or are in a range from 1 to 25 micrometers. In other embodiments the protolayers 22, 23, and 24 each have a uniform thickness of less than 1 micrometer or less than 750 nanometers or less than 500 nanometers or less than 250 nanometers or are in a range from about 100 to about 1000 nanometers.

The formulation of each protolayer 22, 23, and 24 is tailored to provide different electrical properties in the final baked out electrical stack.

While the protolayer stack 20 is illustrated having three layers of differing layer formulations 22, 23, and 24 (or A, B, and C), it is understood that protolayer stack 20 can have four different layer formulations A, B, C, and D or alternating layers such as A, B, A, B, etc. Other layer configurations are possible, including A, A, B, C; A, B, C, A, and layer configurations with repeating subsets of layer groups (e.g. $[AB]_x[CD]_y$, $A[BC]_xD$, etc. where x and y are integers between 1 and 250.

The protolayer stack 20 can be deposited or formed on a polymeric support layer or carrier layer 11 having a releasable surface 13. The polymeric support layer or carrier layer 11 can be implemented with a thermally stable flexible film providing mechanical support for the protolayer stack 20. The polymeric support layer 11 has a releasable surface 13, meaning the polymeric support layer 11 allows for release of protolayer stack 20 applied to the releasable surface 13. The polymeric support layer or carrier layer 11 can be thermally stable above 70° C., or alternatively above 120° C. One example of a carrier film is polyethylene terephthalate (PET).

Various polymeric film substrates comprised of various thermosetting or thermoplastic polymers are suitable for use as the polymeric support layer or carrier layer 11. The polymeric support layer or carrier layer 11 may be a single layer or multi-layer film. Illustrative examples of polymers that may be employed as the carrier layer film include (1) fluorinated polymers such as poly(chlorotrifluoroethylene), poly(tetrafluoroethylene-co-hexafluoropropylene), poly(tetrafluoroethylene-co-perfluoro(alkyl)vinylether), poly(vinylidene fluoride-co-hexafluoropropylene); (2) ionomeric ethylene copolymers poly(ethylene-co-methacrylic acid) with sodium or zinc ions such as SURLYN-8920 Brand and SURLYN-9910 Brand available from E. I. duPont de Nemours, Wilmington, Del.; (3) low density polyolefins such as low density polyethylene; linear low density polyethylene; and very low density polyethylene; plasticized vinyl halide polymers such as plasticized poly(vinylchloride); (4) polyethylene copolymers including acid functional polymers such as poly(ethylene-co-acrylic acid) "EAA", poly(ethylene-co-methacrylic acid) "EMA", poly(ethylene-co-maleic acid), and poly(ethylene-co-fumaric acid); acrylic functional polymers such as poly(ethylene-co-alkylacrylates) where the alkyl group is methyl, ethyl, propyl, butyl, and the like, or $CH_3(CH_2)_n$— where n is 0 to 12, and poly(ethylene-co-vinylacetate) "EVA"; and (5) (e.g.) aliphatic polyurethanes. The polymeric support layer or carrier layer 11 can be an olefinic polymeric material, typically comprising at least 50 wt % of an alkylene having 2 to 8 carbon atoms with ethylene and propylene being most commonly employed. Other polymeric support layers or carrier layers 11 include for example poly(ethylene naphthalate), polycarbonate, poly(meth)acrylate (e.g., polymethyl methacrylate or "PMMA"), polyolefins (e.g., polypropylene or "PP"), polyesters (e.g., polyethylene terephthalate or "PET"), polyamides, polyimides, phenolic resins, cellulose diacetate, cellulose triacetate (TAC), polystyrene, styrene-acrylonitrile copolymers, cyclic olefin copolymers, epoxies, and the like. In some embodiments, the polymeric support layer or carrier layer 11 can include paper, release-coated paper, non-wovens, wovens (fabric), metal films, and metal foils.

In some embodiments, the carrier layer 11 can include sacrificial materials that can remain on the protolayer stack 20 during the bake out process. For example, the carrier layer 11 can include a PMMA release layer on a PET layer where the release layer remains on the protolayer stack 20 following release from the PET layer. Sacrificial materials (such as the PMMA release layer), can be pyrolyzed by subjecting them to thermal conditions that can vaporize or decompose to volatile byproducts substantially all of the organic material present in the sacrificial layers. In these cases the layer can be called a sacrificial release layer. These sacrificial layers can also be subjected to combustion to burn out all of the organic material present in the sacrificial layer. Typically, a clear, high-purity polymer, such as poly(methyl methacrylate), or poly(ethyl acrylate-co-methyl methacrylate), can be used as the sacrificial material. Useful sacrificial materials leave very low organic residue (ash) after pyrolysis or combustion at the bake out temperature.

The protolayer stack 20 can be formed and applied to or disposed on (arrow 2) the support layer or carrier layer 11 by any useful method. In many embodiments, the protolayer stack 20 is formed by sequentially forming each layer 22, 23, 24 on each other. In other embodiments, the protolayer stack 20 is formed by simultaneously extruding or forming each layer 22, 23, 24. A sacrificial adhesive layer 29 can be applied to or disposed on (arrow 4) the protolayer stack 20 to assist in adhering the protolayer stack 20 to the receptor substrate 40 during the lamination process (arrow 5). Alternatively, the sacrificial adhesive can be applied to the receptor substrate, and the transfer film subsequently laminated in a "dry" transfer process. Independent of the process used to prepare it, this laminated transfer film/receptor substrate article 110 can then be baked out (arrow 8) to remove the sacrificial material 26 in the protolayers 22, 23, 24. The resulting baked out article is an electrical stack 25. Sacrificial adhesive 29 and any release material 13 can be baked out also leaving the electrical stack 25 fixed to the receptor substrate 40.

The plurality of protolayers 22, 23 and 24 forming a protolayer stack 20 can be deposited by any coating method or extrusion method, for example. To accomplish these coating or extrusion methods, each layer or selected layers in the protolayer stack can exhibit a complex viscosity of between $10^3$ and $10^4$ Poise at a shear rate of 100/s when heated to a temperature between its $T_g$ and $T_{dec}$.

Examples of receptor substrates 40 include glass such as display mother glass (e.g., backplane mother glass), display cover glass, lighting mother glass, architectural glass, roll glass, and flexible glass. An example of flexible roll glass is commercially available under the trade designation WILLOW glass from Corning Incorporated. Other examples of receptor substrates include metals such as metal parts, sheets and foils. Yet other examples of receptor substrates include sapphire, silicon, silica, and silicon carbide. In many embodiments the receptor substrates 40 is glass, quartz or sapphire. The receptor substrate can comprise a collector electrode (bottom electrode), a transparent conductive oxide coating, a metal foil layer or coating, or a conductive thin film coating such as a thin metal film, a metal nanowire coating, a conductive polymer coating, a carbon nanotube coating, a graphene coating, or a carbon black coating. Other exemplary receptors include semiconductor materials on a support wafer as well as crystalline support wafers such as crystalline silicon, crystalline gallium nitride, crystalline indium phosphide, and crystalline gallium arsenide. The receptor substrates 40 can be flat, or curved.

Display backplane mother glass receptor substrates can optionally include a buffer layer on a side of the receptor substrate to which a lamination transfer film is applied. Examples of buffer layers are described in U.S. Pat. No. 6,396,079, which is incorporated herein by reference as if fully set forth. One type of buffer layer is a thin layer of $SiO_2$, as described in K. Kondoh et al., J. of Non-Crystalline Solids 178 (1994) 189-98, and T-K. Kim et al., Mat. Res. Soc. Symp. Proc. Vol. 448 (1997) 419-23, both of which are incorporated herein by reference as if fully set forth.

A particular advantage of the transfer films and methods described herein is the ability to impart an electrical stack to a substrate with a large surface area, such as display mother glass, photovoltaic glass, or architectural glass. The transfer films 100 described herein have large enough dimensions to be used to impart an electrical stack over, at least, entire large digital display substrates (e.g., a 55 inch diagonal AMOLED HDTV, with dimensions of 52 inches wide by 31.4 inches tall) or photovoltaic module, with dimensions of 1 meter by 1.6 meter, for example.

The sacrificial material in each layer of the protolayer stack 20 can be cleanly baked out leaving a densified layer of thermally stable material defining each layer of the electrical stack 25. In some embodiments, the densified layers of thermally stable material can completely or partially fuse into a glass-like material. FIG. 2A to 2C are schematic diagrams of the electrical protolayer stack 20 densification during the bake out step. In some embodiments, the densified layers are not fully dense and have some porosity. Densified layers may have less than 70% porosity, or less than 60% porosity, or less than 50% porosity, or less than 40% porosity, or less than 30% porosity, or less than 20% porosity, or less than 10% porosity, or less than 5% porosity. Densified layers may have greater than 70% porosity, or greater than 60% porosity, or greater than 50% porosity, or greater than 40% porosity, or greater than 30% porosity, or greater than 20% porosity, or greater than 10% porosity, or greater than 5% porosity. In some embodiments, the densified layers have from about 5% porosity to about 70%, from about 5% porosity to about 60%, from about 5% porosity to about 50%, from about 5% porosity to about 40%, from about 5% porosity to about 30%, from about 5% porosity to about 20%.

A liquid or fluid can then be infused into the porous layer if desired. Liquids may be electrically active liquids and include electrolytes, ionic liquids, liquid crystals, monomer dispersed liquid crystals for use in polymer dispersed liquid crystals, electroactive dyes in solvent, pigment dispersion, or ferrofluids, etc.

FIG. 2 illustrates a protolayer stack 20 formed of three co-extensive electrical protolayers 22, 23, and 24 stacked on each other. A magnified view of layer 22 is illustrated as 2A and shows the thermally stable material 21 dispersed in the sacrificial material 26. It is understood that the layers 23 and 24 also include thermally stable materials (optionally different than the thermally stable material 21) dispersed in the sacrificial material. In many embodiments the sacrificial material is the same kind or same material in each layer forming the electrical protolayer stack 20. In other embodiments the electrical protolayers have different kinds or types of sacrificial material forming each protolayer. The thermally stable material 21 can be present in each protolayer in a range from 1 to 75% wt, or less than 75% wt, or less than 50% wt, or less than 25% wt, or less than 10% wt. In some embodiments, the thermally stable material may be present in each protolayer in a range from about 1 to about 75 weight percent, from about 1 to about 65 weight percent, from about 1 to about 50 weight percent, from about 1 to about 25 weight percent or even from about 1 to about 10 weight percent. In many embodiments the thermally stable material 21 is inorganic nanomaterial. In some embodiments, the thermally stable material may include from about 0 to about 75 weight percent, from about 0 to about 65 weight percent, from about 0 to about 50 weight percent, from about 10 to about 75 weight percent, from about 10 to about 65 weight percent, or even from about 10 to about 50 weight percent inorganic nanomaterial FIG. 2B illustrates an electrical protolayer stack 20 where a portion of the sacrificial material 26 is removed via bake out for example. A magnified view of layer 22 is illustrated as 2B and shows the thermally stable material 21 slightly densified in the sacrificial material 26.

FIG. 2C illustrates an electrical stack 25 where the sacrificial material 26 is removed via bake out for example. A magnified view of layer 22 is illustrated as 2C and shows the thermally stable material 21 densified and forming the electrical stack 25.

The layers forming the electrical stack 25 are co-extensive or interdigitated with each other and each layer has a uniform thickness of less than 10 micrometers, or less than 5 micrometers, or less than 3 micrometers or less than 2 micrometers or less than 1 micrometer or is in a range from 500 nanometers to 2 micrometers. In other embodiments the layers forming the electrical stack 25 are co-extensive or interdigitated with each other and each layer has a uniform thickness of less than 500 nanometers or less than 250 nanometers or less than 100 nanometers or are in a range from 40 nanometers to 500 nanometers.

FIG. 3 is a cross-sectional schematic diagram of a multilayer interdigitated electrode stack 10 with buried electrodes and vertical bus bars 18, 20. FIG. 4 is a cross-sectional schematic diagram of a multilane interdigitated electrode stack 34 with horizontal bus bars 42, 44. These stacks 10, 34 have a first major surface and a second major surface opposite the first major surface, and in-plane direction generally along the first and second major surfaces. The stacks are described with reference to the x, y, and z directions. The x direction is along the length of the stack (along a machine direction), the y direction is along the width of the stack, and the z direction is along a distance between the first and second major surfaces.

The multilayer interdigitated electrode stack 10 includes electrode layers 12 interdigitated with electrode layers 14 between the major surfaces along the in-plane direction of the stack 10. Insulating layers 16 separate the electrode layers 12, 14. A bus bar 18 electrically connects and is integrated with electrode layers 12 at one location between the major surfaces of the stack 10 along the z-direction, for example along a first edge of the stack. A bus bar 20 electrically connects and is integrated with electrode layers 14 at one location between the major surfaces of the stack 10 along the z-direction, for example along a second edge of the stack opposing the first edge. Optional skin layers 15 and 17 can be located on the major surfaces of the stack 10.

The multilane interdigitated electrode stack 34 includes electrode layers 36 interdigitated with electrode layers 38 between the major surfaces along the z-direction. Insulating layers 40 separate the electrode layers 36, 38 from each other. A bus bar 44 electrically connects and is integrated with electrode layers 36 on one major surface of the stack 34 along the in-plane direction, and a bus bar 42 electrically connects and is integrated with electrode layers 38 on the opposing major surface of the stack 34 along the in-plane direction.

Protolayers are precursors to the inorganic layers of the final electrical article. The protolayers may include a thermally stable material and a sacrificial material. The protolayers may also include organometallic compounds, i.e. organometallic precursors that have both thermally stable moieties and sacrificial moieties. The protolayers may include nanomaterials, organometallic compounds, and sacrificial materials. Before the thermal process (i.e., bake-out), the protolayers are processable (e.g. at least one of extrudable, coatable, and curable) and may not possess the requisite electrical properties of the final electrical article. After transfer to a thermally stable surface, the protolayers are baked to form inorganic layers with desired physical, chemical, and electrical properties during a thermal bake-out step. The transformation may involve depolymerization of a sacrificial binder, decomposition of an organometallic polymer or coordination compound, densification of nanoparticles, chemical oligomerization or reaction of organosilanes, etc.

Protolayers and/or layers of the final electrical stack can function as conductors, insulators, functional electrodes, electrolytes, oxidants, or reductants. The electrical protolayers can be formulated, coated, layered in a stack, and baked in such a way that the thermally stable components of the electrical protolayers within the stack densify, stratify, and physically bind together during the bake-out step. The use of electrical protolayers allows for processing of inorganic materials at a low volume loading (e.g. sub-percolation concentrations for conductive materials), enabling techniques such as thermoplastic extrusion of multilayers. Protolayers and/or layers of the final electrical stack can be electrically conducting or electrically insulating. In some embodiments, the electrical protolayer stack includes an electrode protolayer having electrically conductive material and a dielectric protolayer having electrically insulating material.

In some embodiments, the electrical protolayer stack includes a negative electrode protolayer having negative electrode material, a positive electrode protolayer having positive electrode material and an electrolyte protolayer having electrolyte material. The electrolyte protolayer is disposed between the negative electrode protolayer and the positive electrode protolayer.

In some embodiments, the electrical protolayer stack includes a plurality of electrochromic protolayers having electrochromic materials and an electrolyte protolayer having an electrolyte material.

In further embodiments, the protolayer stack includes a first plurality of electrical protolayers interdigitated with a second plurality of electrical protolayers.

One illustrative example of a protolayer formulation comprises a sacrificial thermoplastic or thermoset (e.g. a polyethylene oxide, alkylene polycarbonate, or photocured acrylic), an inorganic nanoparticle (e.g. $BaTiO_3$), and an organosilane (e.g. oligomeric methyl silsesquioxane). During bake out, the sacrificial binder is removed, the particles are densified, and the organosilane remains as an inorganic binder to provide mechanical integrity to the barium titanate layer.

Another illustrative example of a protolayer formulation comprises inorganic nanoparticles and an organometallic polymer or coordination compound (e.g. a metallo polyethyleneimine or metal salt of a polycarboxylated polymer). The polymer undergoes decomposition and, depending upon the atmosphere during decomposition, can be transformed into a metal oxide, nitride, or carbide. In this case, the organometallic polymer has both sacrificial (carbon backbone) and inorganic (complexed metals) components. This type of system has been studied for "polymer assisted deposition" (G. F. Zou et al, Chem. Soc. Rev. 2013, 42, 439-449). The systems are particularly useful for in situ synthesis of complex mixed oxides such as tin or zinc doped indium oxides and other transparent conductive oxides.

Yet another illustrative example of a protolayer formulation comprises a sacrificial polymer, inorganic nanoparticles, and a polymer known to produce graphitic carbon upon thermal decomposition (e.g. a resorcinol formaldehyde oligomer). If the inorganic nanoparticles are carbon nanotubes, the sacrificial polymer is removed during decomposition and the resorcinol formaldehyde oligomer and nanotubes are transformed to a conductive carbon layer composite. Other combinations of materials are possible. For example, it would be desirable to increase conductivity in an inorganic layer by including metal nanowires or nanoparticles in a formulation with a graphitic carbon precursor and a sacrificial thermoplastic. After heating to remove the sacrificial polymer the resulting layer would be a composite of graphitic carbon and conductive nanoparticles or wires.

Protolayer formulations with thermoplastic characteristics may be extruded, molded, or (if soluble) solvent cast. Protolayer formulations with thermoset characteristics may be applied by solvent casting followed by solvent removal and thermal or photochemical curing steps. Each of these methods is compatible with roll to roll processing. Multilayers may be obtained by appropriate techniques including multilayer extrusion (e.g., U.S. Pat. No. 6,827,886) or multilane extrusion (e.g., U.S. Ser. No. 13/775,415), multilayer coating, or slide coating. Interdigitation of the protolayers is possible (e.g., U.S. Ser. No. 13/775,415). The type of interdigitation can be based upon, for example, a desired performance or application of the electrical protolayer stack. The amount of overlap between the interdigitated electrical protolayers can also be varied by increasing or decreasing the amount of overlap, or by purposefully smoothing or sharpening individual elements of the interdigitated protolayers to affect the performance of the electrical stack, for example.

The electrical stacks described herein can be used to produce large area, filmless, durable inorganic electrical devices such as electrochromic windows or devices, photovoltaic devices, capacitors, supercapacitors, batteries, resistors, actuators, and energy harvesters, for example.

Thermally Stable Material

A thermally stable material is utilized to form a layer, e.g. an electrical protolayer, in the electrical stack. The thermally stable material can be densified or chemically transformed to form the inorganic electrical stack. The thermally stable material includes thermally stable molecular species, for example. It is understood that the thermally stable material may include precursor materials that either are or transform into materials that remain substantially intact during the removal of sacrificial materials, such as during "bake-out" or pyrolysis. Thermally stable materials may include inorganic nanoparticles, electrochromic materials, photochromic materials, conducting materials, dielectric materials, and battery materials. In some embodiments, the thermally stable material may include inorganic materials that may be formed, for example, from precursors, particularly organometallic precursors, i.e. organometallic reagents. The organometallic precursors may have both thermally stable moieties and sacrificial moieties. Upon thermal treatment, e.g. bakeout, of protolayers that include organometallic precursors, the thermally stable moieties may be transformed into a thermally stable material, e.g. a metal oxide, and the sacrificial moieties may be removed from the protolayer.

The thermally stable material may include organometallic precursors. The organometallic precursors may be at least one of small molecule organometallic precursors, oligomeric organometallic precursors, and polymeric organometallic precursors. The organometallic precursors may react, for instance upon heating and/or condensation, to form metal oxides, for example. The organometallic precursors that chemically transform, e.g. reacts, into a metal oxide may do so concurrently with removal of sacrificial material. Combinations of at least two or more of the small molecule precursors, oligomer precursors and polymeric precursors may be used. The organometallic precursors; i.e. small molecule organometallic precursors, oligomeric organometallic precursors and polymeric organometallic precursors; may include, but are not limited to, aluminum oxide; barium titanium oxide; indium oxide which may be doped with tin, gallium, zinc, and the like; tin oxide, which may also be doped with, for instance, antimony or fluorine; zirconium oxide; titanium oxide; silicon oxide; zinc oxide, optionally doped with, for instance, fluorine, aluminum, or yttrium; iron oxide; calcium oxide; magnesium oxide; manganese oxide; chromium oxide; copper oxide; vanadium oxide; nickel oxide; barium oxide; strontium oxide; cobalt oxide; niobium oxide; molybdenum oxide; and tungsten oxide organometallic precursors. Combinations may be used to form mixed metal oxide materials. These precursors can be an excellent route to metal oxides, as their pyrolysis in oxygen or air induces decomposition of the precursor, oxidation of the organic ligand portion to volatile fragments, and formation of metal oxide residue. The precursors may also exhibit excellent solubility in organic media, and thus can be formulated with organic polymers and UV-curable resins to fabricate the protolayers of the present disclosure. Nonlimiting examples of metal oxides accessible by this route include oxides of silicon, aluminum, zinc, tin, indium, zirconium, titanium, vanadium, nickel, barium, strontium, niobium, molybdenum, and tungsten. Fluorine-doped metal oxides such as F-doped zinc oxide and F-doped tin oxide can also be prepared by decomposition of organometallic compounds bearing fluorine-containing ligands, such as trifluoroacetate and trifluoroacetonate. Other inorganic species such as metals and metal sulfides can also be prepared in this manner using appropriately chosen organometallic precursors and careful control of the atmosphere during the bakeout to drive off the sacrificial binder. For example, production of metal coatings may be achieved using a reducing environment in place of air, and metal sulfides may be prepared by pyrolysis in a hydrogen sulfide atmosphere.

Small-molecule organometallic precursors include, but are not limited to, metal carboxylate salts such as metal acetates and metal 2-ethylhexanoates; metal ketonates such as metal acetylacetonates, metal (2,2,6,6-tetramethylheptanedionate)s, and metal (methyltrimethylacetylacetate)s; metal dialkylimides such as metal dimethylimides; and metal alkoxides such as metal ethoxides and metal isopropoxides. Other ligands such as thiourea, pyridine and alkyl-substituted pyridines, and halides can also be used, and the above ligands can be used alone or in combination, such as in mixed carboxylate-pyridine complexes or compounds containing acetylacetonate as well as chloride ligands. The above ligands may be suitable for oligomeric and/or polymeric organometallic precursors. Combinations of different small molecule precursors may be used. Small molecule organometallic precursors may have a molecular weight range, for instance, from about 200 g/mol to less than about 600 g/mol.

When using small molecule organometallic precursors, a competition may arise between decomposition and volatilization of the organometallic precursor during the bakeout step. Volatilization is undesirable because it may lower the yield of inorganic material of the thermally stable material. Loss of small molecule organometallic precursor by volatilization may be reduced or eliminated through the use of oligomeric and/or polymeric organometallic precursors.

Oligomeric and polymeric organometallic precursors may be pre-formed and used as the source of the inorganic material of the thermally stable material in the protolayers, as exemplified by commercial products such as aluminum oxide, polymeric precursor, 10% w/v solution in toluene (catalog number 42767); barium titanate oxide, polymeric precursor, oxide approx. 35 wt. % (catalog number 39755); indium oxide, tin doped, polymeric precursor, oxide approx. 20 wt. % (catalog number 42229); and zirconium oxide, polymeric precursor (catalog number 42766), all available from Alfa Aesar, Ward Hill, Mass., and a barium strontium titanate polymeric precursor available under the trade designation SERAMIC BST from Gelest, Inc., Morrisville, Pa. These products are solutions of organic-functional polymeric or oligomeric metal oxide precursors in organic solvents such as alcohols or toluene. They can be coated on inorganic substrates, for example glass, and may be pyrolyzed in air to produce metal oxides in high yields. Oligomeric organometallic precursors may have a molecular weight range from about 600 g/mol to less than about 2000 g/mol. Combinations of different oligomeric organometallic precursors may be used. Polymeric organometallic precursors may have a molecular weight range from about 2000 g/mol to about 1,000,000 or even greater. In some embodiments, polymeric organometallic precursors may have a molecular weight range from about 5000 g/mol to about 1,000,000 or even greater.

Polymeric inorganic precursors can also be generated by reaction of monomeric organometallics such as metal acetylacetonates or metal carboxylates with functional group-bearing polymers such as (meth)acrylic acid copolymers or copoly(meth)acrylic acid precursors. Species such as metal acetylacetonates may be used to crosslink acrylic acid-containing copolymers; this occurs through ligand exchange reactions in which the carboxyl groups on the polymer displace the acetylacetonate ligands. Occurrence of this reaction can be delayed, enabling preparation of stable coating formulations, by masking or protecting the carboxyls in another chemical form exhibiting greatly reduced reactivity with the organometallic reagent, and then deprotecting in a later step. This can be accomplished in a number of ways. One embodiment involves first neutralizing a solution of the carboxyl-functional polymer with a volatile amine such as triethylamine or dimethylethanolamine before addition of the metal acetylacetonate. The resulting ammonium carboxylate reacts much less rapidly with the metal acetylacetonate or metal carboxylate. Once the organometallic reagent is added, the coating formulation is much more stable than in the absence of the amine; when the mixture is coated and dried, the volatile amine is liberated resulting in regeneration of the carboxyl groups. The carboxyl groups then undergo rapid ligand exchange with the organometallic to form the polymeric metal carboxylate in situ. The same end result can also be achieved using highly-substituted alkyl (meth)acrylates such as t-butyl (meth)acrylate as a masked or latent form of (meth)acrylic acid. (Co)polymers of t-butyl (meth)acrylate liberate isobutene on heating, leaving a carboxyl-functional polymer behind. Thus, the t-butyl ester groups perform the equivalent function as the amine-neutralized carboxyls described above, resulting in polymeric metal carboxylates formed in situ. Baking burns off the organic polymeric portion of the coating, generating the metal oxide. These materials can function as the thermally stable material of the protolayers of the present disclosure.

Another approach to polymeric inorganic precursors involves in-situ copolymerization of acrylic-functional organometallic species with acrylic monomers or resins. Some acrylic-functional inorganics are commercially available, such as zinc dimethacrylate, available under the trade designation SR-708, from Sartomer Americas, Exton, Pa. However, these species can have limited solubility in organic solvents and limited compatibility with other acrylic resins, so other analogues with higher organic content and hence better organic compatability can be utilized such as those materials described in U.S. Pat. No. 6,399,672, which is incorporated herein by reference in its entirety. Stable coating formulations containing these metal-functional acrylates and other acrylic monomers and resins can be prepared, coated, dried, and cured to generate polymeric inorganic precursors for use as the thermally stable material of the protolayers of the present disclosure. Such precursors can also be generated in-situ, such as through treatment of organometallic compounds such as metal acetoacetonates, metal alkoxides, or metal carboxylates with functional group-bearing acrylic monomers such as acetylacetoxyethyl (meth)acrylate, acrylic acid, or beta-carboxyethyl acrylate. Such acrylate monomers are capable of reacting into the ligand sphere of the organometallic, generating acrylic-functional organometallic species that can be coated and cured to generate the thermally stable material of the protolayers of the present invention. Examples of metal alkoxide-derived acrylic-functional precursor resins are described in S. S. Dinachali et al, *Adv. Funct. Mater.* 2013, 23, 2201-2211.

In many embodiments the thermally stable material includes inorganic nanoparticles or nanomaterial. These inorganic nanoparticles or nanomaterial can be of various sizes and shapes. The inorganic nanoparticles or nanomaterial can have an average particle diameter less than about 1000 nm, less than about 750 nm, less than about 500 nm, less than about 250 nm, less than about 100 nm, less than about 50 nm, or less than about 35 nm. The inorganic nanoparticles or nanomaterial can have an average particle diameter from about 3 nm to about 1000 nm, from about 3 nm to about 750 nm, from about 3 nm to about 500 nm, from about 3 nm to about 250 nm, from about 3 nm to about 50 nm, or from about 3 nm to about 35 nm, or from about 5 nm to about 25 nm. If the nanoparticles are aggregated, the maximum cross sectional dimension of the aggregated particle can be within any of these ranges, and can also be greater than about 100 nm. Various shapes of the inorganic nanoparticles or nanomaterial may be used, such as sphere, rod, sheet, tube, wire, cube, cone, tetrahedron, and the like. In some embodiments, the thermally stable material may include from about 0 to about 75 weight percent, from about 0 to about 65 weight percent, from about 0 to about 50 weight percent, from about 10 to about 75 weight percent, from about 10 to about 65 weight percent, or even from about 10 to about 50 weight percent inorganic nanoparticles.

The nanomaterial selected can impart various optical properties (i.e. refractive index, birefringence), electrical properties (e.g. conductivity), mechanical properties (e.g. toughness, pencil hardness, scratch resistance) or a combination of these properties. Examples of suitable inorganic nanoparticles or nanomaterial include metal nanoparticles or their respective oxides, including the elements zirconium (Zr), titanium (Ti), hafnium (Hf), aluminum (Al), iron (Fe), vanadium (V), antimony (Sb), tin (Sn), gold (Au), copper (Cu), gallium (Ga), indium (In), chromium (Cr), manganese (Mn), cobalt (Co), nickel (Ni), zinc (Zn), yttrium (Y), niobium (Nb), molybdenum (Mo), technetium (Te), ruthenium (Ru), rhodium (Rh), palladium (Pd), silver (Ag), cadmium (Cd), lanthanum (La), tantalum (Ta), tungsten (W), rhenium (Rh), osmium (Os), iridium (Ir), platinum (Pt), cerium (Ce), strontium (Sr) and any combinations thereof (indium tin oxide, for example).

Further examples of suitable inorganic nanoparticles or nanomaterial include fluorides such as, magnesium fluoride, calcium fluoride, lead fluoride, aluminum fluoride and barium fluoride. Further examples of suitable inorganic nanoparticles include nitrides such as silicon nitride and boron nitride. Further examples of suitable inorganic nanoparticles or nanomaterial include mixed metal titanates such as strontium titanate, barium titanate and barium strontium titanate. Further examples of suitable inorganic nanoparticles include mixed metal oxides (for example, aluminosilicates), mixed metal fluorides, and mixed nitrides.

Other examples of suitable inorganic nanoparticles or nanomaterial include elements and alloys known as semiconductors and their respective oxides such as silicon (Si), germanium (Ge), silicon carbide (SiC), silicon germanide (SiGe), carbon (e. g. carbon nanotubes or graphene nanoplatelets), aluminium nitride (AlN), aluminum phosphide (AlP), boron carbide ($B_4C$), gallium antimonide (GaSb), indium phosphide (InP), gallium arsenide nitride (GaAsN), gallium arsenide phosphide (GaAsP), indium aluminum arsenide nitride (InAlAsN), zinc oxide (ZnO), zinc selenide (ZnSe), zinc sulfide (ZnS), zinc telluride (ZnTe), mercury zinc selenide (HgZnSe), lead sulfide (PbS), lead telluride (PbTe), tin sulfide (SnS), lead tin telluride (PbSnTe), thallium tin telluride ($T_{12}SnTe_5$), zinc phosphide ($Zn_3P_2$), zinc arsenide ($Zn_3As_2$), zinc antimonide ($Zn_3Sb_2$), lead(II) iodide ($PbI_2$), and copper(I) oxide ($Cu_2O$).

Examples of suitable inorganic nanoparticles or nanomaterial include elements known as rare earth elements and their oxides, such as the oxides of lanthanum ($La_2O_3$), cerium ($CeO_2$), praseodymium ($Pr_6O_{11}$), neodymium ($Nd_2O_3$), samarium ($Sm_2O_3$), europium ($Eu_2O_3$), gadolinium ($Gd_2O_3$), terbium ($Tb_4O_7$), dysprosium ($Dy_2O_3$), holmium ($Ho_2O_3$), erbium ($Er_2O_3$), thulium ($Tm_2O_3$), ytterbium ($Yb_2O_3$) and lutetium ($Lu_2O_3$).

Electrochromic materials include but are not limited to at least one of, for example: polyoxometallates (e.g. $PM_{12}O_{40}^{3-}$, $SiW_{12}O_{40}^{4-}$, $W_{10}O_{32}^{3-}$, $[Eu-(H_2O)P_5W_{30}O_{11}]^{12-}$); tungsten oxide ($WO_3$); iridium oxide ($IrO_2$, $Ir(OH)_3$); nickel oxide; hydrous nickel oxide; molybdenum oxide ($MoO_3$); tin oxide ($SnO_2$); vanadium oxide ($V_2O_5$) and lithiated vanadium oxides such as described in U.S. Pat. No. 6,177,130, incorporated herein by reference in its entirety; niobium oxide ($Nb_2O_5$); and titanium oxide ($TiO_2$), transition metal oxides of manganese, cobalt, rhodium, and ruthenium, Prussian Blue ($Fe(III)_4[Fe(II)(CN)_6]_3$ or $KFe(III)Fe(II)(CN)_6$), and metal phthalocyanines (those with sufficient thermal stability). Other materials which can be utilized in electrochromic constructions are described in U.S. Pat. Publ. No. 2012/0200908; C. G. Granqvist, "Oxide electrochromics: An introduction to devices and materials", *Solar Energy Materials & Solar Cells,* 2012, Vol. 99, pp. 1-13; and C. G. Granqvist, "Electrochromics for smart windows: Oxide-based thin films and devices", *Thin Solid Films,* 2014, Vol. 564, pp. 1-38, all incorporated herein by reference in their entirety.

Dielectric material includes but is not limited to at least one of, for example: titanium dioxide; strontium titanate; barium strontium titanate; barium titanate; lead zirconium titanate; calcium copper titanate; silicon dioxide; hafnium silicate; zirconium silicate; hafnium dioxide; and zirconium dioxide.

Positive electrode materials, used in in batteries for example, include but are not limited to at least one of, for example: $LiMO_2$ or $LiMS_2$, where M can be Ti, V, Cr, Mn, Fe, Co, Ni, Mo and mixtures thereof; $LiM_2O_4$, where M can be Ti, V, Cr, Mn, Fe, Co, Ni, Mo and mixtures thereof; $LiMPO_4$, where M can be Ti, V, Cr, Mn, Fe, Co, Ni, and mixtures thereof; and a solid solution of $Li_2MnO_3$ with $LiMO_2$, where M can be Ti, V, Cr, Mn, Fe, Co, Ni, and mixtures thereof.

Negative electrode materials, used in batteries for example, include but are not limited to at least one of, for example, $Li_4Ti_5O_{12}$ (lithium titanium oxide); Natural or synthetic graphite; Si or Si/graphite composites; Si alloys including one or more of Li, Mg, Al, B, P, S, O, C, Ti, Ti, V, Cr, Mn, Fe, Co, Ni, Mo, Zn, Zr; and other alloys that contain at least one or more of Ge, Sn, Pb, B, Al, As and Sb.

Electrolyte materials are electrically insulating but allow ions such as Li ions to transport through them. In some embodiments, the electrolyte materials may be solid state electrolyte materials. Solid state electrolyte materials include, but are not limited to, at least one of, for example, LiSICONs such as LiPON, $Li_{14}Zn(GeO_4)_4$, $Li_{0.36}Si_{0.6}P_{0.4}O_4$, and glasses such as $Li_2S$—$P_2S_5$, $Li_2S$—$SiS_2$—$Li_3PO_4$, and glass-ceramics such as $Li_7P_3S_{11}$, $Li_{(1+x)}Ge_{(2-x)}Alx(PO_4)_3$, and ceramics such as Li-beta-$Al_2O_3$, $Li_3N$, doped $Li_3N$, $La_{0.5}Li_{0.5}TiO_3$, and thiophosphates such as $Li_{3.25}Ge_{0.25}P_{0.75}S_4$, $Li_{10}GeP_2S_{12}$.

In some embodiments, the thermally stable layer may include a porous inorganic dielectric layer. The pores of the porous inorganic dielectric layer may be at least partially filled with an electrically active liquid, e.g. a liquid electrolyte. The liquid electrolyte may be those known in the art. In some embodiments, the liquid electrolyte is at least one of a solvent and a salt. Exemplary liquid electrolytes are described in U.S. Pat. Publ. No. 2012/0200908; C. G. Granqvist, "Oxide electrochromics: An introduction to devices and materials", *Solar Energy Materials & Solar Cells,* 2012, Vol. 99, pp. 1-13; and C. G. Granqvist, "Electrochromics for smart windows: Oxide-based thin films and devices", *Thin Solid Films,* 2014, Vol. 564, pp. 1-38, all incorporated herein by reference in their entirety Sacrificial Materials The sacrificial material is a material capable of being baked out or otherwise removed while leaving the thermally stable material, substantially intact. The sacrificial material includes, for example, the sacrificial material within each protolayer and the optional sacrificial releasable layer and the optional sacrificial adhesive layer, depending upon a construction of the transfer film. The sacrificial material may be a polymer, e.g. an organic polymer. The sacrificial material may be the reaction product of a polymerizable composition, which forms a polymer, and/or may be a polymer, e.g. a previously formed polymer. In many embodiments, the sacrificial material is made from a polymerizable composition, i.e. the sacrificial material may be the reaction product of a polymerizable composition. The polymerizable composition may include monomer, oligomer and/or polymer. The sacrificial material may be a thermoplastic. A thermoplastic may be formed from a polymerizable composition that contains monomer, oligomer and/or polymer that chain extends to form a polymer that is substantially free of cross-linking. The sacrificial material may be a thermoset. A thermoset may be formed from a polymerizable composition that contains monomer, oligomer and/or polymer that crosslink to form a polymer that includes a cross-linked network. In the formation of a thermoset, the monomer, oligomer and/or polymer of the polymerizable composition may also chain extend, increasing the molecular weight of the polymer segment between crosslinks. In many embodiments, the sacrificial material is present in each electrical protolayer in a range from about 25 to about 95 wt %, from about 30 to about 95 wt %, from about 40 to about 95 wt % or even from about from about 50 to about 95 wt %. In some embodiments the sacrificial material is present in each electrical protolayer may be at least 30 wt %, at least 40 wt %, or even at least 50 wt %.

Useful polymerizable compositions comprise curable functional groups known in the art, such as epoxide groups, allyloxy groups, (meth)acrylate groups, vinyl, hydroxyl, carboxylic acid, amino, phenolic, aldehyde, cinnamate, alkene, alkyne, ethylenically unsaturated groups, vinyl ether groups, and any derivatives and any chemically compatible combinations thereof.

The polymerizable composition used to prepare the sacrificial material may contain monofunctional or multifunctional (e.g. di-, tri-, and tetra-) curable moieties, e.g. monomers and/or oligomers. Examples of suitable monofunctional polymerizable precursors useful in preparation of sacrificial polymeric materials include styrene, alpha-methylstyrene, substituted styrene, vinyl esters, vinyl ethers, octyl (meth)acrylate, nonylphenol ethoxylate (meth) acrylate, isobornyl (meth)acrylate, isononyl (meth)acrylate, 2-(2-ethoxyethoxy)ethyl (meth)acrylate, 2-ethylhexyl (meth)acrylate, lauryl (meth)acrylate, beta-carboxyethyl (meth)acrylate, isobutyl (meth)acrylate, t-butyl (meth)acrylate, cycloaliphatic epoxide, alpha-epoxide, 2-hydroxyethyl (meth)acrylate, isodecyl (meth)acrylate, dodecyl (meth) acrylate, n-butyl (meth)acrylate, methyl (meth)acrylate, hexyl (meth)acrylate, (meth)acrylic acid, N-vinylcaprolactam, stearyl (meth)acrylate, hydroxyl functional caprolactone ester (meth)acrylate, isooctyl (meth)acrylate, hydroxypropyl (meth)acrylate, hydroxyisopropyl (meth) acrylate, hydroxybutyl (meth)acrylate, hydroxyisobutyl (meth)acrylate, tetrahydrofurfuryl (meth)acrylate, acetoacetoxyalkyl (meth)acrylates such as acetoacetoxyethyl methacrylate, and any combinations thereof.

Examples of suitable multifunctional polymerizable precursors include ethylene glycol di(meth)acrylate, hexanediol di(meth)acrylate, triethyleneglycol di(meth)acrylate, tetraethylene glycol di(meth)acrylate, trimethylolpropane tri (meth)acrylate, glycerol tri(meth)acrylate, pentaerythritol tri(meth)acrylate, pentaerythritol tetra(meth)acrylate, neopentyl glycol di(meth)acrylate, bisphenol A di(meth)acrylate, poly(1,4-butanediol) di(meth)acrylate, any substituted, ethoxylated or propoxylated versions of the materials listed above, or any combinations thereof.

The polymerization reactions may lead to the formation of a three-dimensional "crosslinked" macromolecular network and are also known in the art as negative-tone photoresists, as reviewed by Shaw et al., "Negative photoresists for optical lithography," IBM Journal of Research and Development (1997) 41, 81-94. The formation of the network may occur through either covalent, ionic, or hydrogen bonding, or through physical crosslinking mechanisms such as chain entanglement. The reactions can also be initiated through one or more intermediate species, such as free-radical generating photoinitiators, photosensitizers, photoacid generators, photobase generators, or thermal acid generators. The type of curing agent used depends on the polymerizable precursor used and on the wavelength of the radiation used to cure the polymerizable precursor. Examples of suitable commercially available free-radical generating photoinitiators include benzophenones, benzoin ethers, and acylphosphine photoinitiators, such as those sold under the trade designations "IRGACURE" and "DAROCUR" from Ciba Specialty Chemicals, Tarrytown, N.Y. Other exemplary photoinitiators include 2,2-dimethoxy-2-phenylacetophenone (DMPAP), 2,2-dimethoxyacetophenone (DMAP), xanthone, and thioxanthone.

Co-initiators and amine synergists may also be included to improve curing rates of the polymerizable compositions. Suitable concentrations of the curing agent in the crosslinking matrix range from about 1 wt % to about 10 wt %, with particularly suitable concentrations ranging from about 1 wt % to about 5 wt %, based on the entire weight of the polymerizable precursor.

Other materials that may be used for the sacrificial material include, polyvinyl alcohol (PVA), polyethylene oxide (PEO), polyethyleneimine (PEI), ethylcellulose, methylcellulose, polynorbornenes, poly(methylmethacrylate (PMMA), poly(vinylbutyral), poly(cyclohexene carbonate), poly(cyclohexene propylene) carbonate, poly(ethylene carbonate), poly(propylene carbonate) and other aliphatic polycarbonates, and any copolymer or blends thereof, and other materials described in R. E. Mistler and E. R. Twiname, Tape Casting: Theory and Practice, American Ceramic Society, 2000, chapter 2, section 2.4, "Binders". There are many commercial sources for these materials. These materials are typically easy to remove via dissolution or thermal decomposition via pyrolysis or combustion. Thermal treatment is typically part of many manufacturing processes and thus removal of the sacrificial material may be accomplished during an existing heating step. For this reason, thermal decomposition via pyrolysis or combustion is a more preferred method of removal.

There are several properties that are preferred in the sacrificial materials. The materials are preferably capable of being coated onto a substrate via slide coating, extrusion, knife coating, solvent coating, cast and cure, or other typical coating methods. It is preferred that the materials be a solid at room temperature. For thermoplastic sacrificial materials, it is preferred that a working temperature, defined as the range between the glass transition temperature ($T_g$), or the temperature range over which the material exhibits viscosity appropriate for extrusion, and the onset of thermal decomposition ($T_{dec}$) is large enough, such as at least 50-100° C., to allow it to be extruded as part of a multilayer film. Polymers used to make films in extrusion operations generally should exhibit complex viscosity in the range between $10^3$ and $10^4$ Poise at a shear rate of 100/sec. Typically, these polymers have a high enough molecular weight to provide an intrinsic viscosity of 0.4 dl/g as measured per ASTM D4603-91 using a 60/40 mixture of phenol/o-dichlorobenzene as the solvent at 30° C.

Materials that thermally decompose with low ash or low total residue are preferred over those that leave higher levels of residue. Residue left behind on a substrate may adversely impact electrical and/or optical properties such as the conductivity, transparency or color of the final product. Since it is desirable to minimize any changes to these properties in the final product, residue levels of less than 1000 ppm are preferred. Residues levels of less than 500 ppm are more preferred and residue level below 50 ppm are most preferred. The term "cleanly baked out" means that the sacrificial layer can be removed by pyrolysis, combustion, sublimation, or vaporization without leaving a substantial amount of residue material such as ash. Examples of preferred residue levels are provided above, although different residue levels can be used depending upon a particular application.

Sacrificial Adhesive Layer

The sacrificial adhesive layer can be implemented with any material enhancing adhesion of the transfer film to the receptor substrate without substantially adversely affecting the performance of the transfer film. This layer can also be described as an adhesion promoting layer. The sacrificial adhesive layer appears to facilitate the final permanent bond between the receptor substrate and the baked-out thermally stable structure. The sacrificial adhesive layer is capable of being cleanly baked out using the methods described herein. Useful sacrificial adhesives or adhesion promoting materials include photoresists (positive and negative), self-assembled monolayers, silane coupling agents, and macromolecules. In some embodiments, silsesquioxanes can function as adhesion promoting layers. Other exemplary materials may include benzocyclobutenes, polyimides, polyamides, silicones, polysiloxanes, silicone hybrid polymers, (meth)acrylates, and other silanes or macromolecules functionalized with a wide variety of reactive groups such as epoxide, episulfide, vinyl, hydroxyl, allyloxy, (meth)acrylate, isocyanate, cyanoester, acetoxy, (meth)acrylamide, thiol, silanol, carboxylic acid, amino, vinyl ether, phenolic, aldehyde, alkyl halide, cinnamate, azide, aziridine, alkene, carbamate, imide, amide, alkyne, and any derivatives or combinations of these groups.

Thus, embodiments of ELECTRICAL MULTILAYER LAMINATION TRANSFER FILMS are disclosed.

All references and publications cited herein are expressly incorporated herein by reference in their entirety into this disclosure, except to the extent they may directly contradict this disclosure. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof. The disclosed embodiments are presented for purposes of illustration and not limitation.

Select embodiments of the present disclosure include, but are not limited to, the following:

In a first embodiment, the present disclosure provides a transfer film comprising:

a plurality of co-extensive electrical protolayers forming an electrical protolayer stack, at least selected or each electrical protolayer independently comprising at least 25 wt % sacrificial material and a thermally stable material and having a uniform thickness of less than 25 micrometers.

In a second embodiment, the present disclosure provides transfer film comprising a plurality of co-extensive electrical protolayers forming an electrical protolayer stack, at least selected or each protolayer independently exhibiting a complex viscosity of between $10^3$ and $10^4$ Poise at a shear rate of 100/s when heated to a temperature between its $T_g$ and $T_{dec}$.

In a third embodiment, the present disclosure provides a transfer film according to claim 1, wherein the plurality of co-extensive electrical protolayers are interdigitated.

In a fourth embodiment, the present disclosure provides a transfer film according to claim 2, wherein the plurality of co-extensive electrical protolayers are interdigitated.

In a fifth embodiment, the present disclosure provides a transfer film according to any one of the first through fourth embodiments, wherein at least selected electrical protolayers are electrically conductive.

In a sixth embodiment, the present disclosure provides a transfer film according to any one of the first through fifth embodiments, wherein each or at least selected electrical protolayers comprise less than 75 wt % inorganic nanomaterials.

In a seventh embodiment, the present disclosure provides a transfer film according to any one of the first through sixth embodiments further comprising a polymeric support layer having a releasable surface, the releasable surface contacting the electrical protolayer stack.

In an eighth embodiment, the present disclosure provides a transfer film according to any one of the first through seventh embodiments, wherein the electrical protolayer stack comprises an electrode protolayer comprising electrically conductive material and a dielectric protolayer comprising electrically insulating material.

In a ninth embodiment, the present disclosure provides a transfer film according to any one of the first through eighth embodiments, wherein the electrical protolayer stack comprises a negative electrode protolayer comprising negative electrode material, a positive electrode protolayer comprising positive electrode material and an electrolyte protolayer comprising electrolyte material and the electrolyte protolayer is disposed between the negative electrode protolayer and the positive electrode protolayer.

In a tenth embodiment, the present disclosure provides a transfer film according to any one of the first through ninth embodiments, wherein the electrical protolayer stack comprises a plurality of electrochromic protolayers comprising electrochromic material and an optional electrolyte protolayer comprising an electrolyte material.

In an eleventh embodiment, the present disclosure provides a transfer film according to the tenth embodiment, wherein the electrochromic material comprises at least one of, tungsten oxide, iridium oxide, nickel oxide, hydrous nickel oxide, molybdenum oxide, vanadium oxide, niobium oxide, titanium oxide, transition metal oxides of manganese, cobalt, rhodium, and ruthenium, Prussian Blue and metal phthalocyanines.

In a twelfth embodiment, the present disclosure provides a transfer film according to the tenth embodiment, wherein the electrochromic material comprises at least one $PW_{12}O_{40}^{3-}$, $SiW_{12}O_{40}^{4-}$, $W_{10}O_{32}^{3-}$, $[Eu-(H_2O)P_5W_{30}O_{11}]^{12-}$, $WO_3$, $IrO_2$, $Ir(OH)_3$, $MoO_3$, $V_2O_5$, $Nb_2O_5$, $TiO_2$, $(Fe(III)_4[Fe(II)(CN)_6]_3$, and $KFe(III)Fe(II)(CN)_6)$.

In a thirteenth embodiment, the present disclosure provides a transfer film according to any one of the first through twelfth embodiments, wherein at least selected electrical protolayers comprise inorganic nanomaterial having an average size of less than 1000 nm.

In a fourteenth embodiment, the present disclosure provides a transfer film according to any one of the first through thirteenth embodiments, wherein sacrificial material comprises an organic polymer material.

In a fifteenth embodiment, the present disclosure provides a transfer film according to any one of the first through fourteenth embodiments, wherein the sacrificial material is present in each electrical protolayer in a range from 25 to 95 wt %.

In a sixteenth embodiment, the present disclosure provides a transfer film according to any one of the first through fifteenth embodiments, wherein the electrical protolayer stack comprises at least 10 electrical protolayers.

In a seventeenth embodiment, the present disclosure provides a transfer film according to any one of the first through sixteenth embodiments, wherein at least selected electrical protolayers comprise inorganic nanoparticles and an organometallic polymer or coordination compound.

In an eighteenth embodiment, the present disclosure provides a method comprising:
laminating a transfer film according to any of the first through seventeenth, thirty-third and thirty-fourth embodiments, to a receptor substrate; and
baking out sacrificial material to form an electrical stack.

In an nineteenth embodiment, the present disclosure provides a method according to the eighteenth embodiment, wherein the baking out step forms at least one porous layer and further comprising infusing the porous layer with an electrically active liquid.

In a twentieth embodiment, the present disclosure provides a method according to the nineteenth embodiment, wherein the electrically active liquid comprises an electrolyte, an electrochromic dye, a liquid crystal, an ionic species or a ferrofluid.

In a twenty-first embodiment, the present disclosure provides a method according to any one of the eighteenth through twentieth embodiments, wherein the receptor substrate comprises glass, quartz or sapphire.

In a twenty-second embodiment, the present disclosure provides a method according to any one of the eighteenth through twentieth embodiments, wherein the receptor substrate comprises an electrically conductive layer.

In a twenty-third embodiment, the present disclosure provides a method according to any one of the eighteenth through twentieth embodiments, wherein the electrical stack forms at least a portion of an electrochromic device.

In a twenty-fourth embodiment, the present disclosure provides a method according to any one of the eighteenth through twentieth embodiments, wherein the electrical stack forms at least a portion of a battery.

In a twenty-fifth embodiment, the present disclosure provides a method according to any one of the eighteenth through twentieth embodiments, wherein the electrical stack forms at least a portion of a capacitor.

In a twenty-sixth embodiment, the present disclosure provides a method according to any one of the eighteenth through twenty-fifth embodiments, wherein the receptor substrate comprises a bottom electrode.

In a twenty-seventh embodiment, the present disclosure provides a method according to any one of the eighteenth through twenty-sixth embodiments further comprising applying a top electrode on the electrical stack.

In a twenty-eighth embodiment, the present disclosure provides a method of forming a transfer film comprising forming a plurality of electrical protolayers to form an electrical protolayer stack, each protolayer independently comprising a sacrificial material and a thermally stable material and having a uniform thickness of less than 25 micrometers.

In a twenty-ninth embodiment, the present disclosure provides a method of forming a transfer film according to the twenty-eighth embodiment, wherein the electrical protolayers are interdigitated.

In a thirtieth embodiment, the present disclosure provides a method of forming a transfer film according to the twenty-eighth or twenty-ninth embodiments, wherein forming a plurality of electrical protolayers comprises coextruding the plurality of electrical protolayers.

In a thirty-first embodiment, the present disclosure provides a method of forming a transfer film according to any one of the twenty-eighth through thirtieth embodiments, wherein each electrical protolayer of the electrical protolayer stack independently exhibits a complex viscosity of between $10^3$ and $10^4$ Poise at a shear rate of 100/s when heated to a temperature between its $T_g$ and $T_{dec}$.

In a thirty-second embodiment, the present disclosure provides a method of forming a transfer film according to any one of the twenty-eighth through thirty-first embodiments, wherein the electrical protolayer stack is formed on a releasable surface of a polymeric support substrate.

In a thirty-third embodiment, the present disclosure provides a transfer film according to any one of the first through seventeenth embodiments, wherein the protolayer stack comprises a first plurality of electrical protolayers interdigitated with a second plurality of electrical protolayers.

In a thirty-fourth embodiment, the present disclosure provides a transfer film according to any one of the first through seventeenth and thirty-third embodiments, wherein each electrical protolayer of the electrical protolayer stack independently exhibits a complex viscosity of between $10^3$ and $10^4$ Poise at a shear rate of 100/s when heated to a temperature between its $T_g$ and $T_{dec}$.

EXAMPLES

Electrical multilayer lamination transfer films were prepared using coating methods. These films were transferred to receptor substrates and some were additionally processed into electrochromic devices.

These examples are merely for illustrative purposes only and are not meant to be limiting on the scope of the appended claims. All parts, percentages, ratios, etc. in the examples and the rest of the specification are by weight, unless noted otherwise. Solvents and other reagents used were obtained from Sigma-Aldrich Chemical Company, St. Louis, Mo. unless otherwise noted.

Material List

| Materials Abbreviation | Description |
|---|---|
| C1 | Vanadyl triisopropoxide (VO(OiPr)$_3$) available from Sigma-Aldrich, Milwaukee, Wisconsin |
| C2 | Niobium 2-ethylhexanoate (Nb(C$_7$H$_{15}$CO$_2$)$_4$) available from Strem Chemicals, Newburyport, Massachusetts. |
| C3 | Niobium ethoxide (Nb(OEt)$_5$) available from Sigma-Aldrich. |
| C4 | Tungsten ethoxide (W(OEt)$_5$) available from Gelest, Morrisville, Pennsylvania. |
| C5 | Tin(II) acetylacetonate (Sn(acac)$_2$) available from Sigma-Aldrich. |
| M1 | Monomer, Beta-carboxyethyl acrylate (CEA) (HO$_2$CCH$_2$CH$_2$OCOCH=CH$_2$) available from Sigma-Aldrich. |
| M2 | Monomer, Acetoacetoxy ethyl methacrylate (ACACEMA) (CH$_3$COCH$_2$CO$_2$CH$_2$CH$_2$OCOC(CH$_3$)=CH$_2$) available from Pfaltz & Bauer, Waterbury, Connecticut. |
| C6 | Molybdenum 2-ethylhexanoate (Mo(C$_7$H$_{15}$CO$_2$)$_4$) available from American Elements, Los Angeles, California. |
| C7 | Acetylacetone (CH$_3$COCH$_2$COCH$_3$) available from Alfa Aesar, Ward Hill, Massachusetts. |
| C8 | Zirconium acetylacetonate (Zr(acac)$_4$) from Sigma-Aldrich. |
| C9 | Molybdenum (V) chloride (MoCl$_5$) from Sigma-Aldrich. |
| PH1 | Photoinitiator, available under the trade designation "IRGACURE 4265" from BASF, Florham Park, New Jersey. |
| B1 | Binder, Poly(propylene carbonate) available under the trade designation "QPAC 40" from Empower Materials, New Castle, Delaware. |
| COP1 | PMMA copolymer solution, 75 wt % methyl methacrylate, 25 wt % ethyl acrylate, 20% wt. solution in 2-butanone, available under the trade designation "PRD510-A" from Altuglas International (North America), Bristol, Pennsylvania. |
| M3 | Monomer, ethoxylated bisphenol A diacrylate, available under the trade designation "SR540" from Sartomer, Warrington, Pennsylvania. |
| PH2 | Photoinitiator, available under the trade designation "IRGACURE 1173" from BASF. |
| PH3 | Photoinitiator, available under the trade designation "IRGACURE TPO" from BASF. |
| NP1 | Nanoparticles, 45.2 wt % solids dispersion of 10 nm zirconia particles prepared as described in U.S. Pat. No. 7,241,437, Example 4. U.S. Pat. No. 7,241,437 is incorporated herein by reference in its entirety. |
| I1 | Polymerization Inhibitor, available under the trade designation "PROSTAB 5198" from BASF, prepared as a 5 wt. % aqueous solution. |
| A1 | PEG350 succinate ester acid prepared from polyethylene glycol 350 and succinic anhydride using methods described in U.S. Pat. No. 8,282,863, Example 1. U.S. Pat. No. 8,282,863 is incorporated herein by reference in its entirety. |
| PSA1 | Pressure-sensitive adhesive solution prepared by diluting a 93:7 (w/w) isooctyl acrylate:acrylic acid copolymer (monomers available from Sigma Aldrich); copolymer prepared using methods described in U.S. Pat. No. 4,737,577, Example 1, diluted to 5 wt % solids in 1:1 (w/w) ethyl acetate:heptane. U.S. Pat. No. 4,737,577 is incorporated herein by reference in its entirety. |
| E1 | Electrolyte, Lithium bis(trifluoromethanesulfonimide) available under the trade designation "HQ-115" from 3M Company, St. Paul, MN. |
| S1 | Surfactant, available under the trade designation "TEGO Rad 2250" from Evonik Industries AG, Essen, Germany. |

Preparation of Release Film

The release substrate used in the Examples was a 2 mil PET film coated with 6 micron thick PMMA copolymer release layer (COP1 solution) using a roll-to-roll web coating process. The coating solution was dried to remove solvent. The PMMA copolymer release layer was further treated with a solvent barrier by applying a solution of M3 50 wt %, PH2 0.5 wt % and PH3 0.1 wt % in 80:20 (w/w) isopropyl alcohol:2-butanone using a roll-to-roll coating process. The coating solution was supplied at a rate of 1 cc/min to a 10.2 cm wide slot type coating die, and applied to the above PMMA-coated PET film substrate moving at a web speed of 305 cm/min to give a wet film thickness of approximately 6.5 microns. Impinging air flow was applied immediately onto the film after coating to remove the bulk of the solvent. The coated web travelled a 3 m span at ambient temperature, then into two 1.5 m drying zones set at 77° C. Finally, the dried coating entered a UV curing chamber equipped with a Fusion System Model I300P H-bulb. The chamber was purged by a gas stream pre-mixed with nitrogen to maintain an oxygen level under 50 ppm. This resulted in the Release Film.

Example 1—Preparation, Transfer, and Baking of Three-Layer Vanadium Oxide/Zirconium Oxide/Tungsten Oxide Precursor Transfer Film Preparation of Tungsten Oxide Precursor Resin Solution Equal parts by weight of C4 and M1 were mixed in a screw-top vial and shaken to give a clear, single-phase light yellow liquid. In an amber glass screw-top jar, a clear, light yellow coating solution was prepared that consisted of 20 wt % of the above liquid and 0.4 wt % PH1 in 90:10 2-butanone:1-methoxy-2-propanol, the Tungsten Oxide Precursor Resin Solution.

Preparation of Zirconium Oxide Precursor Resin Solution

A 500 ml 3-neck round bottom flask was charged with 100.0 grams of NP1. Next, 200.0 grams 1-methoxy-2-propanol (Alfa Aesar, Ward Hill, Mass.) were added to the batch. The batch was held for approximately 15 minutes at room temperature with mixing. Next, 0.38 grams of I1, 7.32 grams of Al and 48.0 grams of M3 were added to the batch with stirring. The batch was placed on a rotary evaporator and the solvent was removed with vacuum and heating to 60° C. The final mixture was a very fluid, nearly clear dispersion, isolated in a yield of 102.3 grams.

In an amber glass screw-top jar, a coating solution was prepared that consisted of 3.33 wt % the above resin, 1.67 wt % C8, and 0.1 wt % PH1 in 90:10 (w/w) 2-butanone:1-methoxy-2-propanol, the Zirconium Oxide Precursor Resin Solution.

Preparation of Vanadium Oxide Precursor Resin Solution

One part by weight C1 and two parts by weight M2 were mixed in a glass screw-top vial and shaken to give a clear, single-phase dark red liquid. In an amber glass screw-top jar, a clear red coating solution was prepared that consisted of 10 wt % the above liquid and 0.2 wt % PH1 in 90:10 (w/w) 2-butanone:1-methoxy-2-propanol, the Vanadium Oxide Precursor Resin Solution.

Preparation, Transfer, and Baking of Three-Layer Transfer Film

A sample of the Release Film prepared above was coated with the following three layers in succession:

1) Tungsten Oxide Precursor Resin Solution using a #9 wire-wound rod (RD Specialties, Webster, N.Y.);
2) Zirconium Oxide Precursor Resin Solution using a #6 wire-wound rod;
3) Vanadium Oxide Precursor Resin Solution using a #6 wire-wound rod.

All coating solutions were filtered through 1 micron filter cartridges just prior to coating. Each layer was dried in a forced-air oven at 70° C. for 2 min and cured by two passes through a Fusion UV Systems, Inc. Lighthammer UV processor equipped with a D type mercury lamp operated at 100% power and using a conveyor speed of 30 ft/min (9.1 m/min) under nitrogen inerting, before application of the next layer. This produced a Three-Layer Precursor Film, i.e. a protolayer stack having three layers.

A receptor substrate, consisting of a glass slide coated with indium tin oxide (50 ohm/sq, Delta Technologies, Loveland, Colo.), was treated with PSA1 by spin coating at 1000 rpm. The sample was placed in a forced-air oven at 120° C. for 5 min to dry the adhesive. The Three-Layer Precursor Film from above was laminated to the adhesive using an adhesive roller under hand pressure, and the laminate was heated in a forced-air oven at 120° C. for 3 min. After cooling, the Release Film was carefully removed, leaving the three-layer precursor layers behind on the glass slide. The glass slide was placed in a THERMOLYNE (available from Thermo Scientific, Grand Island, N.Y.) programmable ceramic oven and heated using a 2° C./min ramp to 300° C., held at that temperature for 2 hr, ramped to 350° C. at 2° C./min, held at that temperature for 2 hr, ramped to 425° C. at 2° C./min, and held at that temperature for 2 hr. It was then allowed to cool to room temperature. The sample was subjected to cross-sectional scanning electron microscopy (SEM) imaging for analysis of the resulting baked three-layer transferred stack. The image showed, in order beginning at the bottom of the image, the glass receptor substrate; ITO layer; vanadium oxide (approximately 137 nm thick); zirconium oxide (approximately 146 nm thick); and tungsten oxide (approximately 128 nm thick), with the total stack thickness approximately 411 nm.

Example 2—Preparation, Transfer, and Baking of Three-Layer Tungsten Oxide/Zirconium Oxide/Vanadium Oxide Precursor Transfer Film The same Release Film substrate, metal oxide resin coating solutions, and methods described in Example 1 were used to prepare a three-layer tungsten oxide/zirconium oxide/vanadium oxide transfer film. All coating solutions were filtered through 1 micron filter cartridges just prior to coating. A sample of the Release Film prepared above was coated with the following three layers in succession:

1) Vanadium Oxide Precursor Resin Solution using a #9 wire-wound rod (RD Specialties, Webster, N.Y.);
2) Zirconium Oxide Precursor Resin Solution using a #8 wire-wound rod;
3) Tungsten Oxide Precursor Resin Solution using a #9 wire-wound rod.

Each layer was dried in a forced-air oven at 70° C. for 2 min and cured by two passes through a Fusion UV Systems, Inc. Lighthammer UV processor equipped with a D type mercury lamp operated at 100% power and using a conveyor speed of 30 ft/min (9.1 m/min) under nitrogen inerting, before application of the next layer. This produced a Three-Layer Precursor Film, i.e. a protolayer stack having three layers.

A receptor substrate consisting of a glass slide coated with indium tin oxide (50 ohm/sq, Delta Technologies, Loveland, Colo.) was treated with PSA1 by spin coating at 500 rpm for 5 sec, then 1000 rpm for 15 sec. The sample was placed in a forced-air oven at 120° C. for 5 min to dry the adhesive.

The Three-Layer Precursor Film from above was laminated to the adhesive using an adhesive roller under hand pressure, and the laminate was heated in a forced-air oven at 120° C. for 3 min. After cooling, the Release Film was carefully removed, leaving the three-layer precursor layers behind on the glass slide. The glass slide was then placed in a THERMOLYNE (Thermo Scientific, Grand Island, N.Y.) programmable ceramic oven and heated using a 2° C./min ramp to 300° C., held at that temperature for 2 hr, ramped to 350° C. at 2° C./min, held at that temperature for 2 hr, ramped to 425° C. at 2° C./min, held at that temperature for 2 hr, and allowed to cool to room temperature. The sample was subjected to cross-sectional SEM imaging for analysis of the resulting baked three-layer transferred stack. The image showed, in order beginning at the bottom of the image, the glass receptor substrate; ITO layer; tungsten oxide (approximately 120 nm thick); zirconium oxide (approximately 86 nm thick); and vanadium oxide (approximately 94 nm thick), with a total stack thickness approximately 300 nm.

The sample was immersed in a solution of 0.5 M El (vacuum dried at 140° C. overnight before use) in acetonitrile (Aldrich, dried over molecular sieves before use) and connected as the working electrode in an electrochemical setup using a Bio-Logic (Knoxville, Tenn.) SP-300 potentiostat equipped with a silver wire reference electrode and a platinum mesh counter electrode. Application of –0.8 V (vs the reference) to the working electrode caused lithiation of the tungsten oxide bottom layer and formation of a pronounced blue color. Switching the voltage to +1.0 V vs the reference caused fading to a very light blue, almost colorless delithiated state. The coating could be cycled multiple times between dark and light states in this half-cell configuration. The sample was switched at 200 mV/sec between –0.8 V and +1.0 V vs Ag wire reference, holding for 1 min at each voltage. Reversible delithiation charge transfer was approximately 9.4 mC/cm$^2$.

Examples 3-6—Additional Resins Useful in Metal Oxide Precursor Films

Example 3

Equal parts by weight of C2 and M1 were mixed in a glass screw-top vial. After shaking, the initially hazy mixture became a clear, light yellow, single-phase liquid with good stability to storage at room temperature. This liquid resin was diluted to 20 wt % solids in 90:10 (w/w) 2-butanone:1-methoxy-2-propanol or acetylacetone (C7) and formulated with photoinitiator such as PH1 to yield coating solutions for preparation of UV-curable coatings useful in transfer film constructions.

Example 4

Equal parts by weight of C5 and M2 were mixed in a glass screw-top vial to give a clear single-phase orange liquid resin. This resin was diluted to 10 wt % in 2-butanone or acetylacetone (C7) to give coating solutions for use in preparation of transfer films. Coatings of this resin applied from 10 wt % solution in acetylacetone (C7) to glass slides by spin coating (250 to 2000 rpm) were allowed to dry in air then baked in a ceramic oven at 550° C. for 1 hr to yield clear, mechanically robust films of tin(IV) oxide.

Example 5

Equal parts by weight of C6 and M1 were mixed in a glass screw-top vial. After shaking, a clear, very dark red single-phase liquid resin was obtained. This resin was dissolved at 10 wt % in 2-butanone and could be formulated with photoinitiator such as PH1 to yield coating solutions for preparation of UV-curable coatings useful in transfer film constructions.

Example 6

A glass screw-top vial was charged with 0.7 g C9, 3.5 g 20 wt % solids solution of B1 in 2-butanone, and 9.8 g of 2-butanone. The resulting mixture was shaken to yield a clear, dark red single-phase solution containing 5 wt % B1 solids and 5 wt % C9. This solution was coated to yield dried layers useful in preparation of transfer film constructions. It was spin coated (1000 rpm/60 sec) on a glass slide, and the solvent was allowed to flash off at room temperature. The slide was placed in a programmable ceramic oven and heated using a 2° C./min ramp to 300° C., held at that temperature for 2 hr, ramped to 350° C. at 2° C./min, held at that temperature for 4 hr, and then allowed to cool to room temperature. SEM cross-sectional imaging of the resulting molybdenum oxide coating showed thickness of 120-230 nm.

Example 7—Preparation of Two- and Three-Layer Transfer Films by Inline Slot Die Coating Preparation of Vanadium Oxide Precursor Resin Solution 2

One part by weight C1 and two parts by weight M2 were mixed in a glass screw-top vial and shaken to give a clear, single-phase dark red liquid. In an amber glass screw-top jar, a clear red coating solution was prepared that consisted of 20 wt % the above liquid and 0.4 wt % PH1 in 90:10 (w/w) 2-butanone:1-methoxy-2-propanol, the Vanadium Oxide Precursor Resin Solution 2.

Preparation of Niobium Oxide Precursor Resin Solution

One part by weight C2 and one part by weight M2 were mixed in a glass screw-top vial and shaken to give an initially cloudy mixture which clarified within a few seconds to a clear, light yellow, single-phase liquid. In an amber glass screw-top jar, a coating solution was prepared that consisted of 20 wt % the above liquid, 0.4 wt % PH1, and 0.03 wt % S1, the Niobium Oxide Precursor Resin Solution.

A sample of the Release Film prepared above was coated with solutions of the metal oxide precursor resins in a roll-to-roll coating process. First, the above Vanadium Oxide Precursor Resin Solution 2 was supplied at a rate of 1 cc/min to a 10.2 cm wide slot type coating die, and applied to the Release Film substrate moving at a web speed of 152 cm/min. Impinging air flow was applied immediately onto the film after coating to remove the bulk of the solvent. The coated web travelled a 3 m span at ambient temperature, then into two 1.5 m drying zones set at 77° C. Finally, the dried coating entered a UV curing chamber equipped with a Fusion System Model I300P H-bulb. The chamber was purged by a gas stream pre-mixed with nitrogen to maintain an oxygen level under 50 ppm. A portion of the resulting One-Layer Precursor Film was coated again, this time with the Zirconium Oxide Resin Precursor Solution of Example 1, supplied at a rate of 2 cc/min to the film web moving at a web speed of 305 cm/min. Impinging air flow was applied immediately onto the film after coating to remove the bulk of the solvent. The coated web travelled a 3 m span at ambient temperature, then into two 1.5 m drying zones set at 77° C. Finally, the dried coating entered a UV curing chamber equipped with a Fusion System Model I300P H-bulb. The chamber was purged by a gas stream pre-mixed with nitrogen to maintain an oxygen level under 50 ppm, producing a Two-Layer Precursor Film, i.e. a protolayer stack having two layers. A sample of the Two-Layer Transfer Film was subjected to cross-sectional imaging analysis by SEM. The image showed an approximately 90 nm thick bottom layer of vanadium oxide precursor resin and an approximately 97 nm thick top layer of zirconium oxide precursor resin, on the release layer.

A portion of the resulting Two-Layer Precursor Film was coated again, this time with the Niobium Oxide Resin Precursor Solution, supplied at a rate of 3 cc/min to the film web moving at a web speed of 305 cm/min. Impinging air flow was applied immediately onto the film after coating to remove the bulk of the solvent. The coated web travelled a 3 m span at ambient temperature, then into two 1.5 m drying zones set at 77° C. Finally, the dried coating entered a UV curing chamber equipped with a Fusion System Model I300P H-bulb. The chamber was purged by a gas stream pre-mixed with nitrogen to maintain an oxygen level under 50 ppm, producing a Three-Layer Precursor Film, i.e. a protolayer stack having three layers. The Three-Layer Precursor Film was subjected to cross-sectional imaging analysis by SEM. The image showed the PET film substrate, the release layer with thickness approximately 12 microns, and three layer protolayer stack consisting of the vanadium oxide precursor layer with thickness approximately 97 nm, then the zirconium oxide precursor layer with thickness approximately 63 nm, and then the niobium oxide precursor layer with thickness approximately 290 nm. The total stack thickness was approximately 450 nm.

Example 8

A glass screw-top vial was charged with 0.07 g C9, 7.0 g 20 wt % solids solution of B1 in 2-butanone, and 6.93 g of 2-butanone. The resulting mixture was shaken to yield a clear, dark red single-phase solution containing 10 wt % B1 solids and 0.5 wt % C9. The solution was allowed to stand overnight at room temperature, then coated on the Two-Layer Precursor Film from Example 7 using a knife coater set at a gap of 40 microns. The film was dried in a forced-air oven at 70° C. for 2 min, producing a Three-Layer Precursor Film, i.e. a protolayer stack having three layers. The sample was subjected to cross-sectional imaging analysis by SEM. The image showed the molybdenum oxide precursor layer with thickness approximately 1 micron on the vanadium oxide and zirconium oxide precursor layers present on the original Two-Layer Precursor Film.

What is claimed is:

1. A transfer film comprising:
a plurality of co-extensive electrical protolayers forming an electrical protolayer stack, at least selected or each protolayer independently exhibiting a complex viscosity of between $10^3$ and $10^4$ Poise at a shear rate of 100/s when heated to a temperature between its $T_g$ and $T_{dec}$, wherein the plurality of co-extensive electrical protolayers are interdigitated.

2. A method, comprising:
laminating a transfer film to a receptor substrate, the transfer film comprising a plurality of co-extensive electrical protolayers forming an electrical protolayer stack, at least selected or each electrical protolayer independently exhibiting a complex viscosity of between $10^3$ and $10^4$ Poise at a shear rate of 100/s when heated to a temperature between its $T_g$ and $T_{dec}$, wherein the plurality of co-extensive electrical protolayers are interdigitated; where at least selected or each electrical protolayer independently comprising at least 25 wt % sacrificial material and a thermally stable material and having a uniform thickness of less than 25 micrometers; and backing out sacrificial material to form an electrical stack.

3. A method according to claim 2, wherein the baking out step forms at least one porous layer and further comprising infusing the porous layer with an electrically active liquid.

4. A method according to claim 3, wherein the electrically active liquid comprises an electrolyte, an electrochromic dye, a liquid crystal, an ionic species or a ferrofluid.

5. A method according to claim 2, wherein the receptor substrate comprises glass, quartz or sapphire.

6. A method according to claim 2, wherein the receptor substrate comprises an electrically conductive layer.

7. A method according to claim 2, wherein the electrical stack forms at least a portion of an electrochromic device.

8. A method according to claim 2, wherein the electrical stack forms at least a portion of a battery.

9. A method according to claim 2, wherein the electrical stack forms at least a portion of a capacitor.

10. A method according to claim 2, wherein the receptor substrate comprises a bottom electrode.

11. A method according to claim 2 further comprising applying a top electrode on the electrical stack.

* * * * *

UNITED STATES PATENT AND TRADEMARK OFFICE
CERTIFICATE OF CORRECTION

PATENT NO. : 11,273,630 B2
APPLICATION NO. : 16/532618
DATED : March 15, 2022
INVENTOR(S) : Wolk et al.

Page 1 of 1

It is certified that error appears in the above-identified patent and that said Letters Patent is hereby corrected as shown below:

In the Claims

Column 28
Line 25 (approx.), In Claim 2, delete "backing" and insert -- baking --, therefor.

Signed and Sealed this
Eleventh Day of October, 2022

Katherine Kelly Vidal
*Director of the United States Patent and Trademark Office*